United States Patent [19]
Okuda et al.

[11] Patent Number: 5,995,031
[45] Date of Patent: Nov. 30, 1999

[54] D/A AND A/D CONVERTERS

[75] Inventors: Takashi Okuda; Toshio Kumamoto; Masao Ito; Takahiro Miki, all of Tokyo, Japan

[73] Assignee: Mitsubishi Denki Kabushiki Kaisha, Tokyo, Japan

[21] Appl. No.: 08/968,207

[22] Filed: Nov. 12, 1997

[30] Foreign Application Priority Data

Jul. 9, 1997 [JP] Japan .................................. 9-183773

[51] Int. Cl.⁶ .................................................. H03M 1/66
[52] U.S. Cl. .......................................... 341/144; 341/143
[58] Field of Search .................................. 341/118, 143, 341/144, 150

[56] References Cited

U.S. PATENT DOCUMENTS

| | | | |
|---|---|---|---|
| 5,036,322 | 7/1991 | Barrow et al. | 341/144 |
| 5,293,166 | 3/1994 | Ta | 341/118 |
| 5,406,283 | 4/1995 | Leung | 341/143 |
| 5,726,652 | 3/1998 | Giuroiu | 341/154 |
| 5,760,726 | 6/1998 | Koifman et al. | 341/145 |
| 5,856,799 | 1/1999 | Hamasaki et al. | 341/144 |

FOREIGN PATENT DOCUMENTS 2-253719  10/1990  Japan .
4-152715  5/1992  Japan .

OTHER PUBLICATIONS

Rex T. Baird et al., "Linearity Enhancement of Multibit ΔΣ A/D and D/A Converters Using Data Weighted Averaging," IEEE Transactions on Circuits and Systems—II: Analog and Digital Signal Processing, vol. 42, No. 12, Dec. 1995, pp. 753–762.

*Primary Examiner*—Michael Tokar
*Assistant Examiner*—Peguy JeanPierre
*Attorney, Agent, or Firm*—Burns, Doane, Swecker & Mathis, LLP

[57] ABSTRACT

A multi-bit D/A converter which improves the linearity of an analog output relative to a digital input is provided. A switch control circuit (1) turns on D some of a plurality of switches (S1 to SM) which are arranged in ascending order starting with a switch determined by a start position determination circuit (3) and turns off the remaining switches, the number of switches turned on being dependent on a digital signal (DIG). The start position determination circuit (3) sequentially changes the switches (S1, S3, S5, . . . ) serving as a selection start position to determine the selection start position for each input of the digital signal (DIG) provided in synchronism with a clock signal (CLK).

15 Claims, 21 Drawing Sheets

D/A AND A/D CONVERTERS

BACKGROUND OF THE INVENTION

1. Field of the Invention

The present invention relates to a D/A converter (DAC) for converting a digital signal to an analog signal by switching on/off a plurality of current sources based on the digital signal.

2. Description of the Background Art

At the present time, an oversampling ΔΣ conversion technique is widely used as the voice grade data conversion technique. FIG. 30 is a block diagram of an A/D converter using the oversampling ΔΣ conversion technique. As shown in FIG. 30, an analog input signal AI is applied to an anti-aliasing filter 11. The anti-aliasing filter 11 removes the high-frequency components of the analog input signal AI to apply the resultant analog input signal AI to a ΔΣ modulator 12.

The ΔΣ modulator 12 noise-shapes the analog input signal AI while oversampling the analog input signal AI at a frequency (n (≧2)·fS) higher than a sampling frequency fS to apply a ΔΣ modulated digital signal to a decimation filter 13. The decimation filter 13 extracts digital signals at a rate of one in every n digital signals from the ΔΣ modulator 12 to output each of the extracted digital signals as a digital output signal DO.

The ΔΣ modulator 12 comprises a subtracter 14, an integrator 15, a quantizer 16, and an internal DAC 17. The integrator 15 integrates an analog difference signal outputted from the subtracter 14. The quantizer 16 quantizes the output from the integrator 15 to output a digital signal (containing noise components) to the decimation filter 13 and to the internal DAC 17. The internal DAC 17 converts the digital signal to an analog signal to feed back the analog signal for subtraction to the subtracter 14. The integrator 15 functions to integrate the analog difference signal for a period of time 1/(n·fS) to cause a delay of one oversampling time.

The subtracter 14 then subtracts the analog signal for subtraction (corresponding to the analog signal AI delayed by one oversampling time) provided from the internal DAC 17 from the analog input signal AI provided from the anti-aliasing filter 11 to output the analog difference signal to the integrator 15. As a result, a noise shaping group formed by the subtracter 14, the integrator 15, the quantizer 16, and the internal DAC 17 removes the noise components of the analog input signal AI to apply a high-accuracy digital signal to the decimation filter 13.

FIG. 31 is a block diagram of a D/A converter using the oversampling ΔΣ conversion technique. As shown in FIG. 31, an interpolation filter 21 performs an operation based on original data given from a digital input signal DI to determine interpolation data, and then interpolates the interpolation data into the original data to output a digital signal oversampled at a frequency n ·fS to a ΔΣ modulator 22.

The ΔΣ modulator 22 noise-shapes the oversampled digital signal to apply the noise-shaped digital signal to an internal DAC 23. The internal DAC 23 converts the ΔΣ modulated digital signal from the ΔΣ modulator 22 to an analog signal to output the analog signal to a low-pass filter 24. The low-pass filter 24 removes the high-frequency components of the analog signal provided from the internal DAC 23 to output an analog output signal AO.

The ΔΣ modulator 22 comprises a subtracter 25, an integrator 26, and a quantizer 27. The integrator 26 integrates a digital difference signal outputted from the subtracter 25. The quantizer 27 quantizes the output from the integrator 26 to output a ΔΣ modulated digital signal (containing noise components) to the internal DAC 23 and to feed back the ΔΣ modulated digital signal as a digital signal for subtraction to the subtracter 24. The integrator 26 functions to integrate the digital difference signal for a period of time 1/(n·fS) to cause a delay of one oversampling time.

The subtracter 25 then subtracts the digital signal for subtraction (corresponding to the digital signal from the interpolation filter 21 which is delayed by one oversampling time) provided from quantizer 27 from the digital signal provided from the interpolation filter 21 to output the digital difference signal to the integrator 26. As a result, a noise shaping group formed by the subtracter 25, the integrator 26, and the quantizer 27 removes the noise components of the digital signal to apply a high-accuracy digital signal to the internal DAC 23.

As above described, the oversampling ΔΣ conversion technique requires the internal DAC in each of the A/D and D/A converters. The internal DAC in the AID converter serves as a feedback signal processing circuit of the noise shaping group, and the internal DAC in the D/A converter serves as a circuit for converting the noise-shaped digital signal to the analog signal. The conventional internal DACs have been 1-bit DACs. The use of the 1-bit DAC provides a simple structure and ensures the linearity of an analog output from the DAC relative to a digital input to the DAC. On the other hand, the 1-bit DAC is disadvantageous in producing a large amount of quantization noise and having the problem of system stability. To overcome the disadvantages, multi-bit DACs have recently been introduced as the internal DACs. However, the multi-bit DAC presents difficulties in matching between the elements thereof, and fails to provide the linearity which has been ensured by the 1-bit DAC.

FIG. 32 illustrates an internal structure of a conventional 3-bit D/A converter. As shown in FIG. 32, unit current sources IS1 to IS7 are connected at their first ends to a power supply Vcc, and connected at their second ends to the first ends of switches S1 to S7, respectively. The second ends of the switches S1 to S7 are commonly connected to a node N1 serving as an output portion. The 3-bit D/A converter requires ($2^3$−1) current sources as shown in FIG. 32. The current sources IS1 to IS7 supply currents I1 to I7 having the same quantity IE.

A switch control circuit 10 outputs a control signal SC to the switches S1 to S7 on the basis of a digital signal DIG to turn on some of the switches S1 to S7 which are arranged in ascending order of reference characters starting with the switch S1 while turning off the remaining switches, the number of switches turned on being dependent upon the digital signal DIG.

For example, if the digital signal DIG is "011" (3), the switch control circuit 10 outputs the control signal SC which turns on the switches S1 to S3 and turns off the switches S4 to S7, as shown in FIG. 33. If the digital signal DIG is "010" (2), the switch control circuit 10 outputs the control signal SC which turns on the switches S1 and S2 and turns off the switches S3 to S7, as shown in FIG. 34.

Current at the node N1 is provided as an output current Iout to an I-V converter 2. The I-V converter 2 current-to-voltage converts the output current Iout to an output voltage Vout which is an analog signal. The output current Iout equals 3·IE in the arrangement shown in FIGS. 33, and the output current Iout equals 2·IE in the arrangement shown in FIG. 34.

In this manner, the multi-bit D/A converter employing current sources enables a predetermined number of current sources depending on the input digital data (DIG) to convert the digital data DIG to the analog signal (output voltage Vout).

Japanese Patent Application Laid-Open No. 4-152715 (1992) discloses a D/A converter which randomly selects a given number of capacitors depending on an input code to perform D/A conversion.

However, perfect coincidence of the characteristics of the unit current sources IS1 to IS7 (the quantities of currents I1 to I7) is difficult because of variations in process and the influences of peripheral circuit elements during layout.

The conventional 3-bit D/A converter enables current sources in response to the digital input signal (DIG), starting with the same current source at all times.

For example, if the digital signal DIG is not "000", the switch S1 is always turned on to enable the current source IS1.

This causes a particular current source (the current source IS1 in the arrangement shown in FIG. 32) to be enabled an inordinate number of times Thus, the difference in characteristics between the individual current sources pronouncedly appears in the output from the D/A converter, resulting in the degradation of the linearity.

The conventional multi-bit D/A converter constructed as above described has been disadvantageous in poor linearity of the analog output relative to the digital input.

SUMMARY OF THE INVENTION

A first aspect of the present invention is intended for a D/A converter for converting a multi-bit digital signal to an analog signal in synchronism with a clock signal. According to the present invention, the D/A converter comprises: a plurality of unit electricity quantity generating portions connected in parallel in predetermined order to an output portion, the quantity of electricity associated with a selected number of unit electricity quantity generating portions among the plurality of unit electricity quantity generating portions being developed at the output portion; a start position determination portion for sequentially changing and determining a selection start position of the plurality of unit electricity quantity generating portions in synchronism with the clock signal; a selection portion receiving the digital signal in synchronism with the clock signal and for selecting some of the plurality of unit electricity quantity generating portions in the predetermined order starting with the selection start position, the number of selected unit electricity quantity generating portions being determined by the digital signal; and an analog signal output portion for outputting the analog signal on the basis of the quantity of electricity provided at the output portion.

Preferably, according to a second aspect of the present invention, in the D/A converter of the first aspect, the digital signal comprises an N-bit digital signal, where $N \geq 2$; the plurality of unit electricity quantity generating portions comprise L unit electricity quantity generating portions, where $L \geq 3$; and the start position determination portion determines the selection start position while shifting the selection start position by a displacement count A in the predetermined order in synchronism with the clock signal, where A<L.

Preferably, according to a third aspect of the present invention, in the D/A converter of the first aspect, the start position determination portion determines first to P-th selection start positions sequentially changed for first to P-th time periods in one cycle of the clock signal, respectively, where $P \geq 2$; the selection portion selects some of the unit electricity quantity generating portions in the predetermined order starting with the first to P-th selection start positions for the first to P-th time periods, respectively, the number of selected unit electricity quantity generating portions being determined by the digital signal; and the analog signal generating portion outputs the analog signal based on the average of the quantities of electricity provided at the output portion for the first to P-th time periods.

Preferably, according to a fourth aspect of the present invention, in the D/A converter of the third aspect, the digital signal comprises an N-bit digital signal, where $N \geq 2$; the plurality of unit electricity quantity generating portions comprises L unit electricity quantity generating portions, where $L \geq 3$; and the start position determination portion determines the first to P-th selection start positions while shifting the first to P-th selection start positions by a displacement count A in the predetermined order in synchronism with the clock signal, where A <L.

Preferably, according to a fifth aspect of the present invention, in the D/A converter of the fourth aspect, the number N of bits of the digital signal and the number L of unit electricity quantity generating portions satisfy $L>2^N-1$.

Preferably, according to a sixth aspect of the present invention, in the D/A converter of the fourth aspect, the number L of unit electricity quantity generating portions and the displacement count A are prime to each other.

Preferably, according to a seventh aspect of the present invention, in the D/A converter of the fifth aspect, the number N of bits of the digital signal and the number L of unit electricity quantity generating portions satisfy $L=2^N$.

Preferably, according to an eighth aspect of the present invention, in the D/A converter of the first aspect, the plurality of unit electricity quantity generating portions comprise a plurality of current sources, each of the current sources supplying predetermined fixed current to the output portion when selected; and the analog signal output portion comprises a current-to-voltage converter portion for converting current provided at the output portion to voltage specified as the analog signal.

Preferably, according to a ninth aspect of the present invention, in the D/A converter of the first aspect, the plurality of unit electricity quantity generating portions comprise a plurality of capacitors each having a first electrode, and a second electrode connected commonly to the output portion, each of the capacitors receiving first voltage at its first electrode when selected and receiving second voltage at its first electrode when not selected; and the analog signal output portion comprises a signal line connected to the output portion, the output portion providing voltage specified as the analog signal on the signal line.

A tenth aspect of the present invention is intended for a $\Delta\Sigma$ A/D converter comprising a $\Delta\Sigma$ modulation portion for $\Delta\Sigma$ modulating and converting an analog signal to a digital signal. According to the present invention, the $\Delta\Sigma$ modulation portion comprises: a subtracter for determining a difference between an analog input signal and an analog signal for subtraction to output an analog difference signal; an integrator for integrating the analog difference signal; a quantizer for quantizing an output from the integrator to output a multi-bit digital signal; and a multi-bit internal D/A converter for converting the digital signal to the analog signal for subtraction to output the analog signal for subtraction, the internal D/A converter comprising a D/A converter as recited in the first aspect.

An eleventh aspect of the present invention is intended for a ΔΣ D/A converter. According to the present invention, the ΔΣ D/A converter comprises: a ΔΣ modulation portion for ΔΣ modulating a multi-bit digital signal to output a ΔΣ modulated digital signal; and a multi-bit internal D/A converter for converting the ΔΣ modulated digital signal to an analog signal to output the analog signal, the internal D/A converter comprising a D/A converter as recited in the first aspect.

As above described, in the D/A converter of the first aspect of the present invention, the start position determination portion sequentially changes the selection start position of the plurality of unit electricity quantity generating portions in synchronism with the clock signal, and the selection portion selects some of the unit electricity quantity generating portions in the predetermined order starting with the selection start position, the number of selected unit electricity quantity generating portions being determined by the digital signal.

Since the selection start position is changed for each cycle of the clock signal, different combinations are selected among the plurality of unit electricity quantity generating portions if the digital signal determines the same number of unit electricity quantity generating portions.

As a result, the plurality of unit electricity quantity generating portions are selected with equal frequency independently of the values of the digital signal. This reduces the tendency for the difference in electric characteristics between the individual unit electricity quantity generating portions to appear in the output analog signal, improving the linearity of the analog output relative to the multi-bit digital input.

Further, the selection portion selects some of the unit electricity quantity generating portions in the predetermined order starting with the selection start position, the number of selected unit electricity quantity generating portions being determined by the digital signal, thus requiring the information about only the single selection start position in addition to the digital signal. The conventional D/A converter randomly selects capacitors the number of which depends on the input code, requiring the information about the selected number of selected capacitors in addition to the digital signal. The difference in circuit structure between the conventional D/A converter and the D/A converter of the present invention appears pronounced since the difference in the amount of required information increases in proportion to the number of bits of the input digital signal.

The start position determination portion of the D/A converter of the second aspect of the present invention shifts the selection start position by the displacement count A (<L (the number of unit electricity quantity generating portions)) in the predetermined order in synchronism with the clock signal to determine the selection start position.

Thus, the start position determination portion may be of relatively simple circuit construction which includes addition portions for determining a maximum of L output values while adding the displacement count A.

In this manner, the start position determination portion for determining the selection start position which is the information required by the selection portion in addition to the digital signal is implemented by the simple circuit structure. Thus, it is found that the D/A converter of the present invention has an advantage in simplification of the circuit structure over the conventional D/A converter.

In the D/A converter of the third aspect of the present invention, the start position determination circuit determines the first to P-th selection start positions (P≧2) sequentially changed for the first to P-th time periods in one cycle of the clock signal, respectively. The selection portion selects some of the unit electricity quantity generating portions in the predetermined order starting with the first to P-th selection start positions for the first to P-th time periods, respectively, the number of selected unit electricity quantity generating portions being determined by the digital signal. The analog signal generating portion outputs the analog signal based on the average of the quantities of electricity provided at the output portion for the first to P-th time periods.

For D/A conversion of the single value of the digital signal, P combinations of the unit electricity quantity generating portions are selected. Thus, for D/A conversion of the single digital signal, the unit electricity quantity generating portions are generally equally selected. This reduces the tendency toward the appearance of the difference in characteristics between the individual unit electricity quantity generating portions, achieving a more correct analog signal output.

The start position determination portion of the D/A converter of the fourth aspect of the present invention determines the first to P-th selection start positions while shifting the first to P-th selection start positions by the displacement count A (<L) in the predetermined order in synchronism with the clock signal.

Thus, the start position determination portion may be of relatively simple circuit construction which includes addition portions for determining a maximum of L output values while adding the displacement count A.

In the D/A converter of the fifth aspect of the present invention, the number L of unit electricity quantity generating portions is greater than the number $(2^N-1)$ of unit electricity quantity generating portions required for the N-bit D/A conversion. The flexibility of the selection start position increases with the number of redundant unit electricity quantity generating portions. This further reduces the tendency for the difference in characteristics between the individual unit electricity quantity generating portions to appear in the analog signal, improving the linearity of the analog output relative to the digital input.

In the D/A converter of the sixth aspect of the present invention, the number L of unit electricity quantity generating portions and the displacement count A used for changing the selection position are prime to each other. The start position determination portion may determine L selection start positions. The maximum use of the flexibility of the selection start position further reduces the tendency for the difference in characteristics between the individual unit electricity quantity generating portions to appear in the analog signal, improving the linearity of the analog output relative to the digital input.

In the D/A converter of the seventh aspect of the present invention, the number L of unit electricity quantity generating portions equals $2^N$. Thus, the start position determination portion may be of relatively simple circuit construction which includes simple addition portions for outputting L N-bit addition results ($L=2^N$) while adding the displacement count A.

In the D/A converter of the eighth aspect of the present invention, the plurality of unit electricity quantity generating portions comprise the plurality of current sources each of which supplies the predetermined fixed current to the output portion when selected, improving the linearity of the analog output relative to the digital input by using the current source array technique.

In the D/A converter of the ninth aspect of the present invention, the plurality of unit electricity quantity generating portions comprise the plurality of capacitors each having the first electrode which receives the first voltage when selected and which receives the second voltage when not selected, improving the linearity of the analog output relative to the digital input by using the capacitor array technique.

The ΔΣ A/D converter of the tenth aspect of the present invention uses the D/A converter as recited in the first aspect as the multi-bit internal D/A converter in the ΔΣ modulation portion.

Thus, the internal D/A converter is the multi-bit internal D/A converter which reduces quantization noise and has good stability. Additionally, the internal D/A converter ensures the linearity of the analog output relative to the digital input. Therefore, the ΔΣ A/D converter of the tenth aspect achieves the A/D conversion having high operating performance.

The ΔΣ D/A converter of the eleventh aspect of the present invention uses the D/A converter as recited in the first aspect as the multi-bit internal D/A converter for D/A conversion of the ΔΣ modulated digital signal.

Thus, the internal D/A converter is the multi-bit internal D/A converter which reduces the quantization noise and has good stability. Additionally, the internal D/A converter ensures the linearity of the analog output relative to the digital input. Therefore, the ΔΣ D/A converter of the eleventh aspect achieves the D/A conversion having high operating performance.

It is therefore an object of the present invention to provide a multi-bit D/A converter which improves the linearity of an analog output relative to a digital input.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
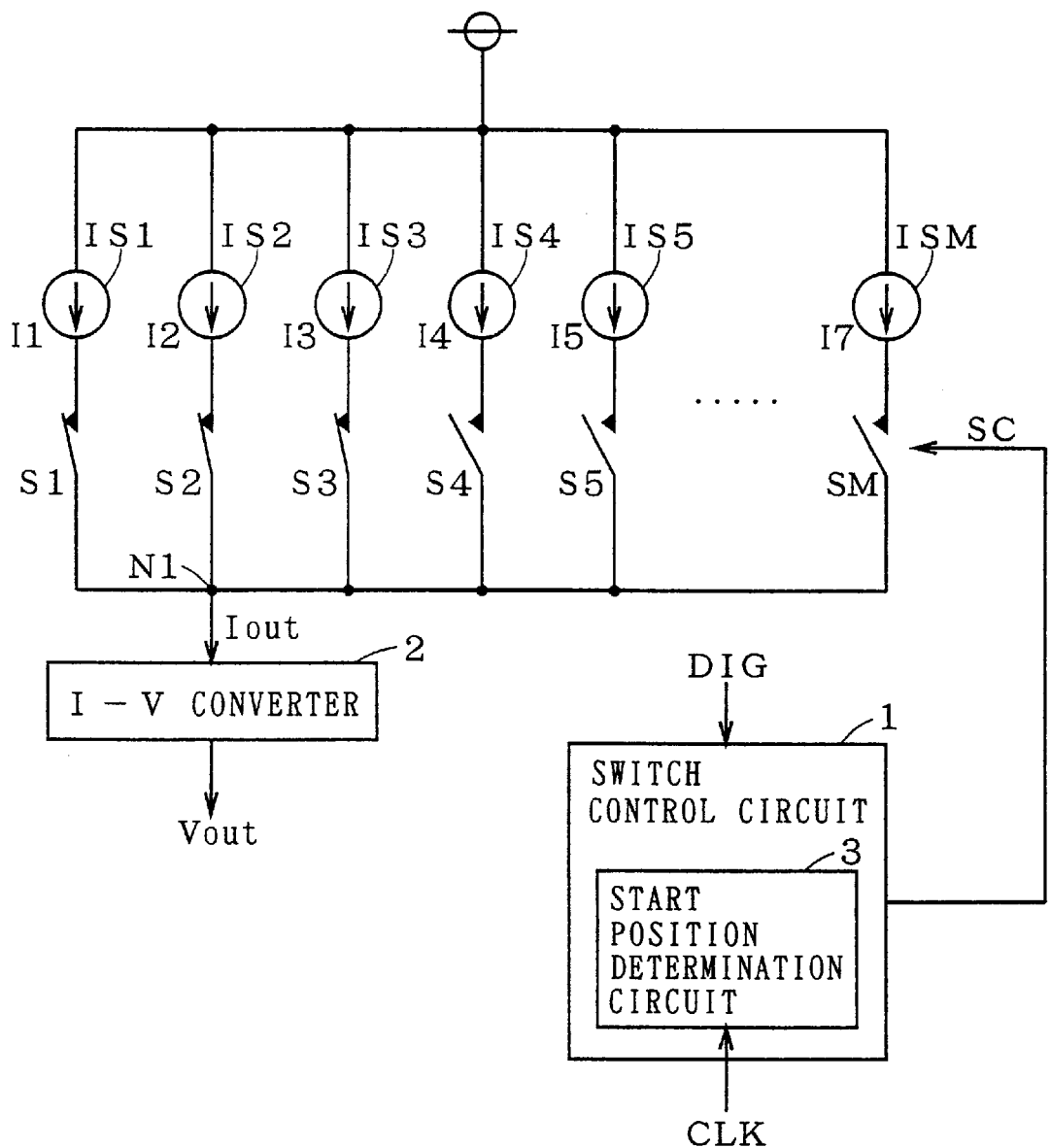
FIG. 1 illustrates a structure of a D/A converter according to a first preferred embodiment of the present invention.

FIG. 1 illustrates a structure of an N-bit D/A converter ($N \geq 2$) according to a first preferred embodiment of the present invention. As shown in FIG. 1, unit current sources IS 1 to ISM are connected at their first ends to a power supply Vcc, and connected at their second ends to the first ends of switches S1 to SM, respectively, where M denotes the number of required current sources and equals $2^N - 1$.

The second ends of the switches S1 to SM are connected commonly to a node N1. The N-bit D/A converter is designed so that the current sources IS1 to ISM supply currents I1 to IM having the same quantity IE.

A switch control circuit 1 outputs a control signal SC to the switches S1 to SM on the basis of a digital signal DIG to turn on some of the switches S1 to SM which are arranged in ascending order of reference characters (from "1" to "M", and then to "1") starting with a switch determined by a start position determination circuit 3 while turning off the remaining switches, the number of switches turned on being dependent upon the digital signal DIG.

In response to a clock signal CLK indicative of the input timing of the digital signal DIG, the start position determination circuit 3 sequentially changes the switches serving as a selection start position to determine the selection start position, e.g. S1, S3, S5, . . . , for each input of the digital signal DIG provided in one cycle of the clock signal CLK.

Figure 4:
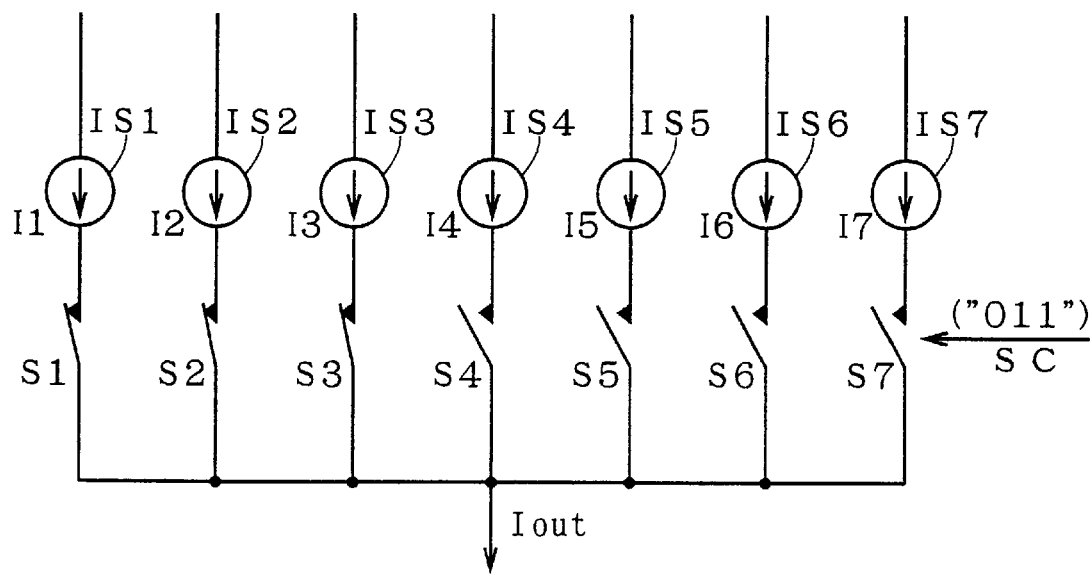
FIGS. 4 and 5 illustrate D/A conversion according to the first preferred embodiment.
Figure 5:
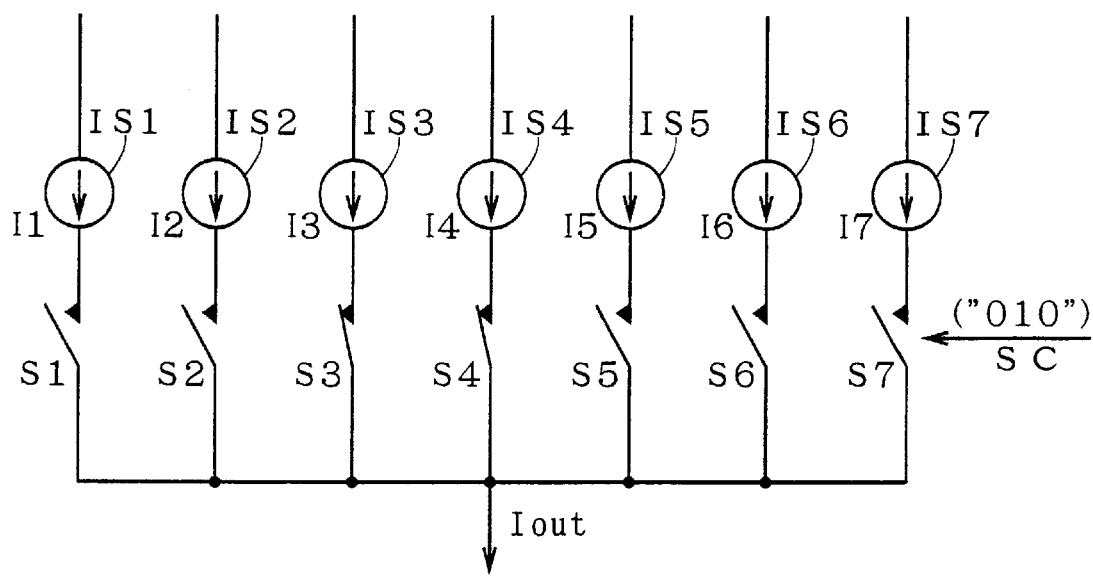

For example, it is assumed that N=3 (M=7), the digital signal DIG is provided in the following order: "011" (3) and "10" (2), and the start position determination circuit 3 determines the start position in the following order: the switch S1 and the switch S3. In this case, the switch control circuit 1 outputs the control signal SC which turns on the switches S1 to S3 and turns off the switches S4 to S7 as shown in FIG. 4, and then outputs the control signal SC which turns on the switches S3 and S4 and turns off the switches S1, S2, and S5 to S7 as shown in FIG. 5.

Figure 2:
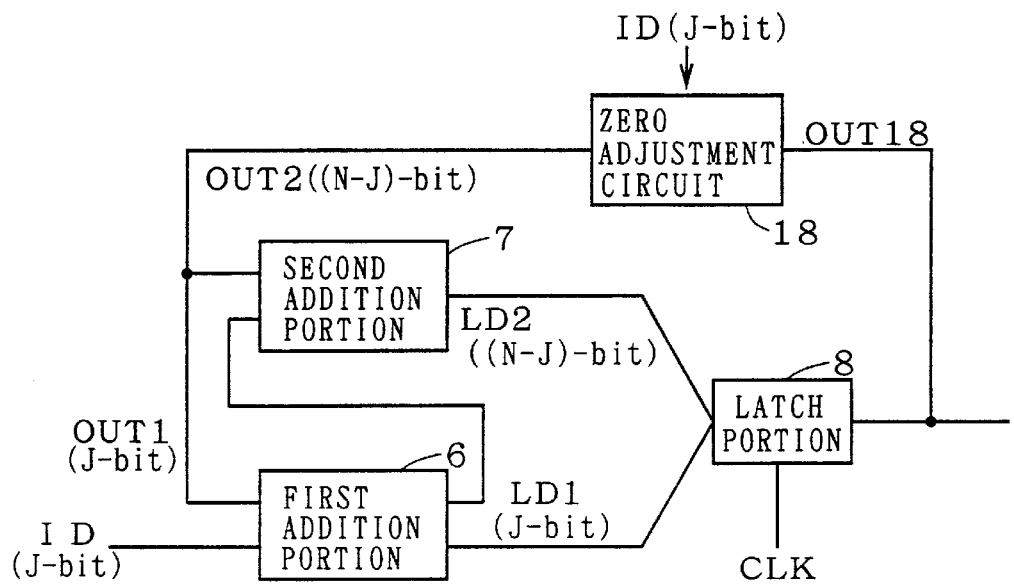
FIG. 2 is a block diagram showing an internal structure of a switch control circuit shown in FIG. 1.

FIG. 2 is a block diagram showing an internal structure of the start position determination circuit 3. As shown in FIG. 2, the start position determination circuit 3 comprises a first addition portion 6, a second addition portion 7, and a latch portion 8.

The first addition portion 6 adds J-bit displacement data ID ($J \leq N$) and partial latch data LD1 which is the low-order J bits of N-bit latch data LD indicative of the previous start position latched ba the latch portion 8 together to output a J-bit addition result OUT1 and a carry output COUT.

The second addition portion 7 adds the carry output COUT from the first addition portion 6 and partial latch data LD2 which is the high-order (N–J) bits of the N-bit latch data LD together to output an (N–J)-brit addition result OUT2.

A zero adjustment circuit 18 outputs an addition result OUT18 which equals an addition result {OUT1+OUT2} comprised of the addition result OUT2 in its high-order position and the addition result OUTI in its low-order position if the addition result {OUT1+OUT2} is not all 0s, and which equals a value comprised of the displacement data ID in its low-order J-bit position and a zero in its high-order bit position if the addition result {OUT1+OUT2} is all 0s.

The latch portion 8 comprises a flip-flop and the like, and stores the addition result OUT18 from the zero adjustment circuit 18 as new N-bit latch data LD under timing control of the clock signal CLK. The latch portion 8 has an initial value "1" when it is reset. Thus, the latch data LD has M bit patterns other than all 0s. The start position determination circuit 3 associates the M bit patterns of the latch data LD with the M current sources IS in one-to-one correspondence to specify the selection start position of the current sources IS by using the latch data LD.

Figure 3:
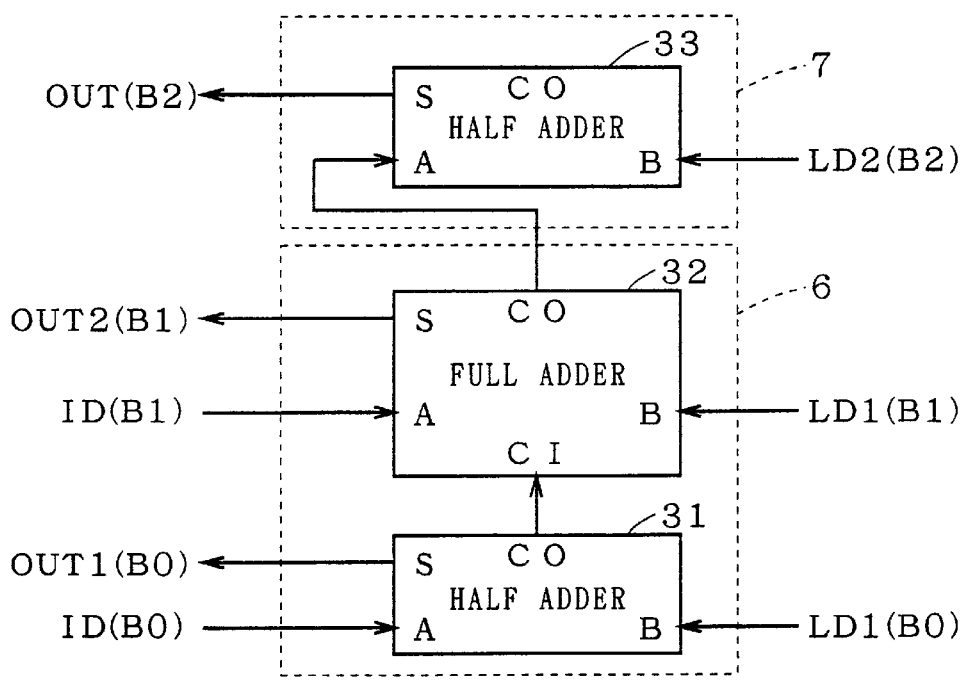
FIG. 3 is a circuit diagram showing an internal structure of first and second addition portions shown in FIG. 2.

FIG. 3 is a circuit diagram showing a specific arrangement of the first and second addition portions 6 and 7 of FIG. 2 where N=3 and J=2. As shown in FIG. 3, the first addition portion 6 includes a half adder 31 and a full adder 32. The half adder 31 receives the least significant bit ID(B0) of the displacement data ID at its A input, and the least significant bit LD1(B0) of the partial latch data LD1 at its B input to output the least significant bit OUT1(B0) of the addition result OUT1 at its addition output S and to apply a carry output to the carry input CI of the full adder 32.

The full adder 32 receives the first bit ID(B1) of the displacement data ID at its A input, and the first bit LD1(B1) of the partial latch data LD1 at its B input to output the first bit OUT1(B1) of the addition result OUT1 at its addition output S and to apply the carry output COUT to the second addition portion 7.

The second addition portion 7 includes a half adder 33. The half adder 33 receives the carry output COUT from the full adder 32 at its A input, and the most significant bit LD2(B2) of the partial latch data LD2 at its B input to output the most significant bit OUT2(B2) of the addition result OUT2 at its addition output S.

The start position determination circuit 3 constructed as shown in FIGS. 2 and 3 associates the bit patterns "001" to "111" of the 3-bit latch data LD with the current sources IS1 to IS7, respectively, to determine the selection start position of the current sources IS in such a manner that the first selection start position is the current source IS1 (the switch S1 is turned on), the second selection start position is the current source IS4, and subsequent selection start positions are in the following order: IS7, IS2, IS5, IS3, IS6, IS1, . . . .

The first addition portion 6 must comprise the full adder (s) except the first stage whereas the second addition portion 7 may comprise only the half adder by connecting the carry output of the previous stage to the addition input of the next stage without receiving the displacement data ID. Thus, the second addition portion 7 may be of simpler circuit construction than the first addition portion 6.

In this manner, the start position determination circuit 3 may he implemented by a relatively simple circuit arrangement including the N-bit adders, the latch portion, and the simple logic circuit (zero adjustment circuit 18) so that the M output bit patterns are provided as the displacement data ID is basically added.

Referring again to FIG. 1, current at the node N1 is applied as an output current Iout to an I-V converter 2. The output current Iout equals 3·IE in the arrangement shown in FIG. 4, and equals 2·IE in the arrangement shown in FIG. 5 The I-V converter 2 converts the output current Iout to an output voltage Vout which is an analog signal.

As above described, the N-bit D/A converter of the first preferred embodiment selects the current sources the number of which is determined by the digital signal DIG, starting with the current source in the selection start position determined by the start position determination circuit 3 for each sampling of the digital signal DIG in response to the input digital data (DIG) to convert the digital data DIG to the analog signal (output voltage Vout).

This increases the number of combinations of the current sources to be selected when the digital signal DIG has the same value, and allows the current sources to be selected with equal frequency independently of the values of the digital signal DIG. The tendency for the difference in characteristics between the individual current sources to appear in the analog output from the D/A converter is reduced. Therefore, the degradation of the linearity of the analog output relative to the digital input is effectively suppressed.

Second Preferred Embodiment

The first preferred embodiment shows only that the current sources as the selection start position determined by the start position determination circuit 3 are changed for each sampling. A second preferred embodiment of the present invention changes the current sources as the selection start position so that the current sources IS1 to IS7 are selected with more equal frequency. Thus, the D/A converter of the second preferred embodiment is similar in general construction to that of the first preferred embodiment shown in FIG. 1 except that the start position determination circuit 3 determines the selection start position in a manner to be described below.

The start position determination circuit 3 finds such a positive number A that the positive number A and the number M ($=2^N-1$) of current sources in the N-bit DIA converter are prime to each other and M>A to shift the selection start position by the displacement count A for each determination of the selection start position.

For example, when N=3, that is, M=7 and A=5 (7 and 5 are prime to each other), the first selection start position is the current source IS1 (the switch S1 is turned on), the second selection start position is the current source IS6, and subsequent selection start positions are in the following order: IS4, IS2, IS7, IS5, IS3, IS1, IS6, . . . . In this manner, all of the current sources IS are selected as the selection start position with completely equal frequency using a relatively great shift of the selection start position.

Figure 6:
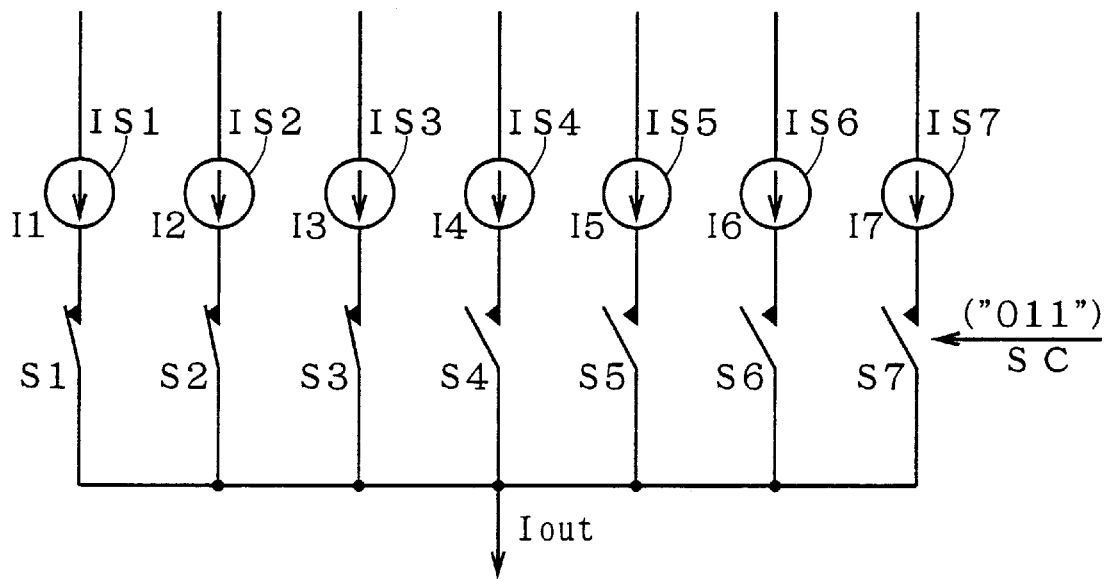
FIGS. 6 and 7 illustrate the D/A conversion according to a second preferred embodiment of the present invention.
Figure 7:
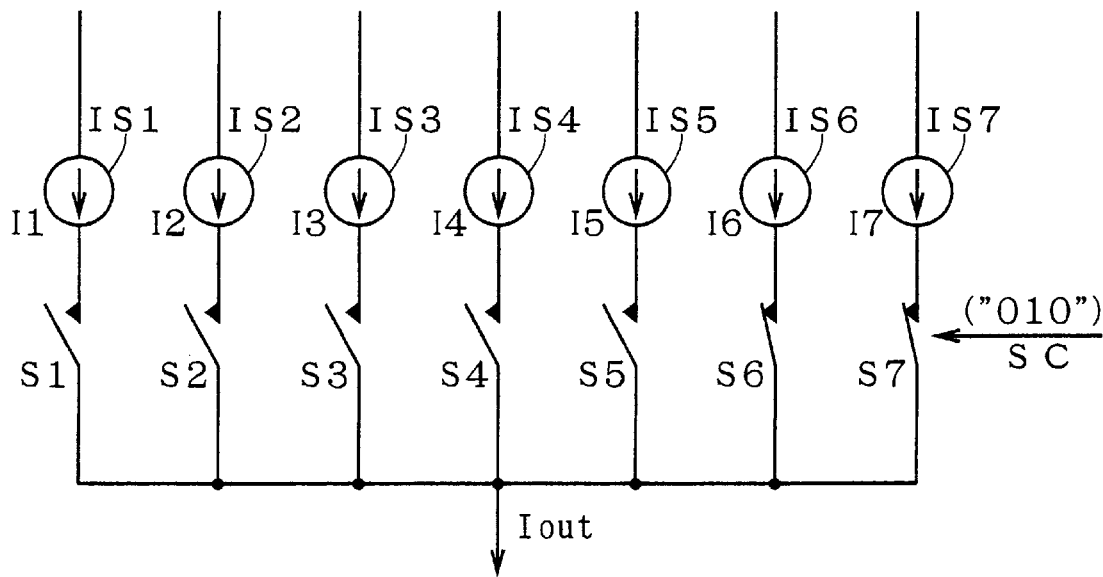

If the digital signal DIG which is "011" (3) is applied to the D/A converter during the first sampling, the current sources IS1 to IS3 are selected as shown in FIG. 6. If the digital signal DIG which is "010" (2) is applied to the D/A converter during the second sampling, the current sources IS6 and IS7 are selected as shown in FIG. 7.

As above described, the start position determination circuit 3 of the D/A converter of the second preferred embodiment determines the selection start position by shifting the selection start position by the displacement count which is prime to the number of current sources to provide the flexibility of the M start positions, maximizing the number of combinations of the current sources to be selected depending on the values of the digital signal DIG. Consequently, the tendency for the difference in characteristics between the individual current sources to appear in the analog output from the D/A converter is further reduced. Therefore, the linearity of the analog output relative to the digital input is improved.

Third Preferred Embodiment

Figure 8:
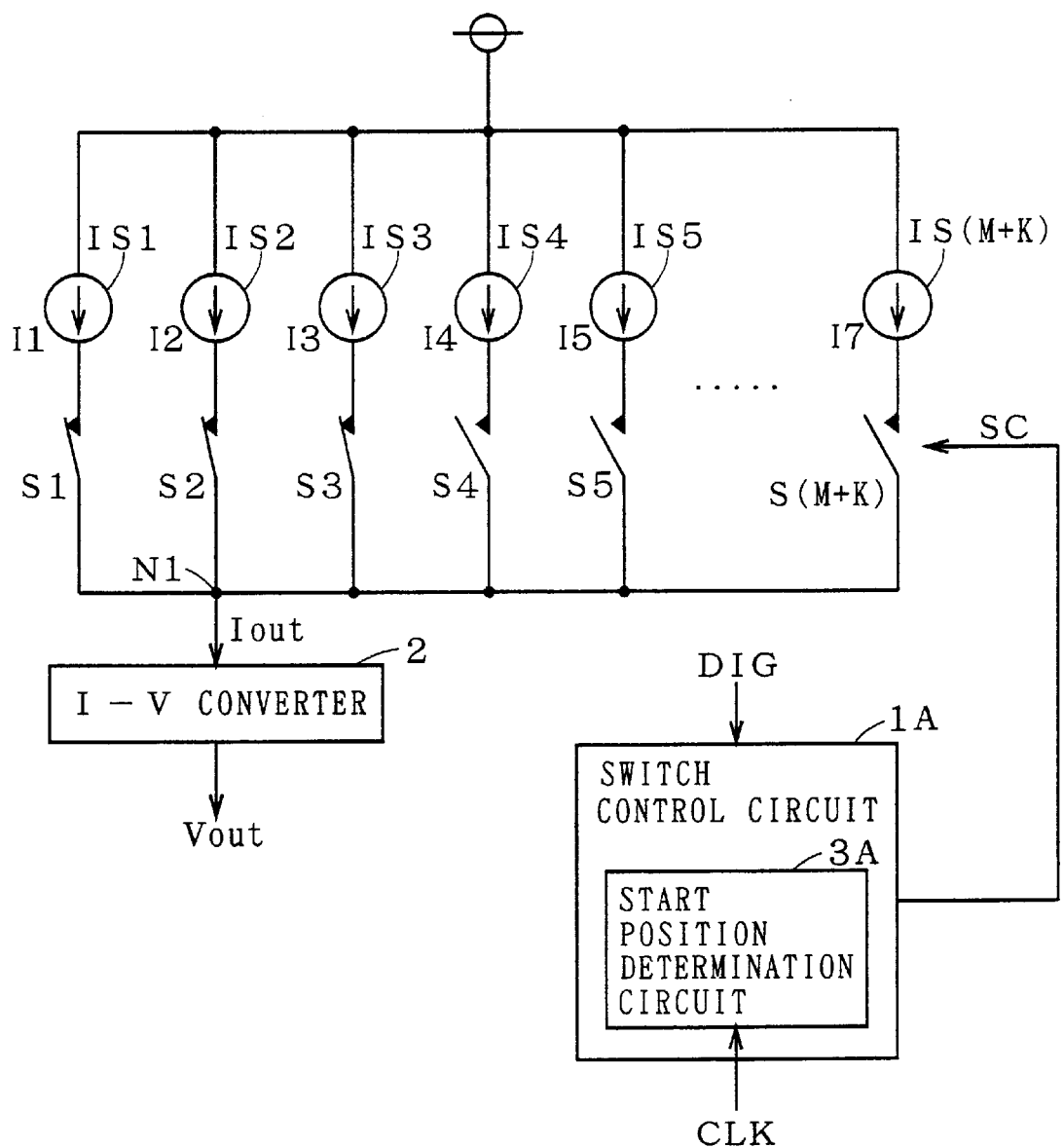
FIG. 8 illustrates a structure of the D/A converter according to a third preferred embodiment of the present invention.

FIG. 8 illustrates a structure of the N-bit D/A converter ($N \geq 2$) according to a third preferred embodiment of the present invention. As shown in FIG. 8, unit current sources IS1 to IS(M+K) are connected at their first ends to the power supply Vcc, and connected at their second ends to the first ends of switches S1 to S(M+K), respectively, where M denotes the number of required current sources and equals $2^{N-1}$, and K denotes the number of redundant current sources.

The second ends of the switches S1 to S(M+K) are connected commonly to the node N1. The N-bit D/A converter is designed so that the current sources IS1 to IS(M+K) supply currents I1 to I(M+K) having the same quantity IE.

A switch control circuit 1A outputs the control signal SC to the switches S1 to S(M+K) on the basis of the digital signal DIG to turn on some of the switches S1 to S(M+K) which are arranged in ascending order of reference characters starting with a switch determined by a start position determination circuit 3A while turning off the remaining switches, the number of switches turned on being dependent upon the digital signal DIG.

In response to the clock signal CLK indicative of the input timing of the digital signal DIG, the start position determination circuit 3A sequentially changes the switches serving as the selection start position to determine the selection start position, e.g. S1, S3, S5, ..., for each input of the digital signal DIG.

Figure 9:
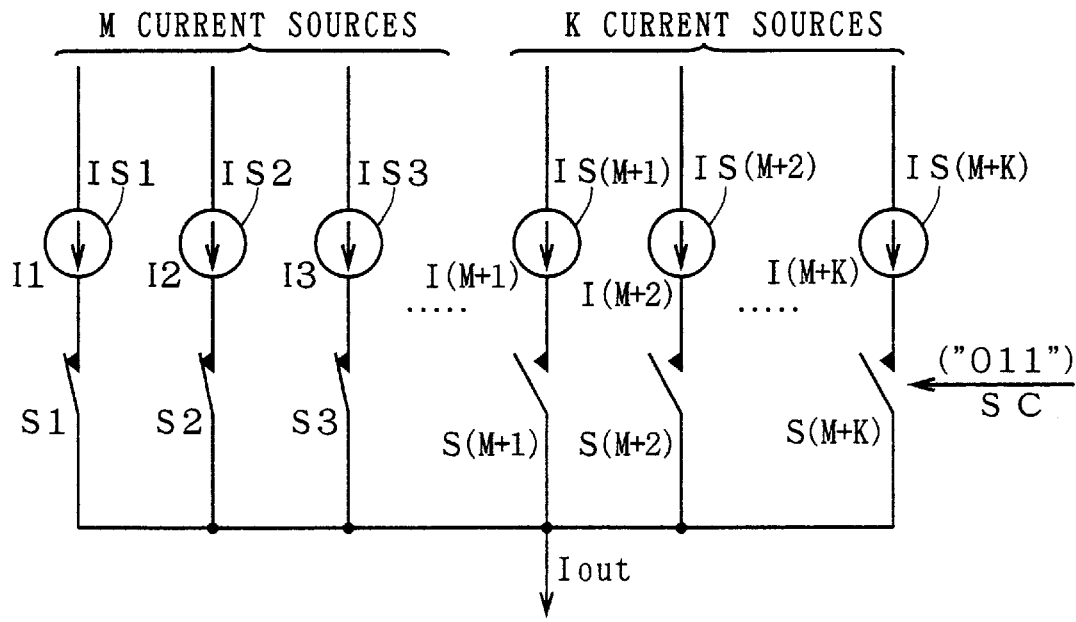
FIGS. 9 and 10 illustrate the D/A conversion according to the third preferred embodiment.
Figure 10:
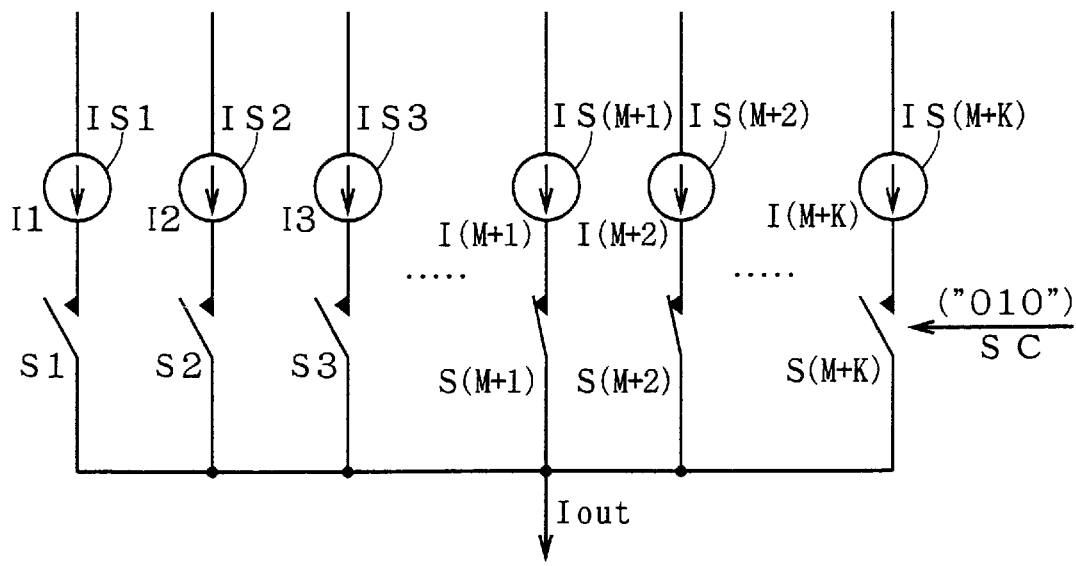

For example, it is assumed that the digital signal DIG is provided in the following order: "011" (3) and "010" (2), and the start position determination circuit 3A determines the selection start position in the following order: the switch S1 and the switch S(M+1). In this case, the switch control circuit 1A outputs the control signal SC which turns on the switches S1 to S3 and turns off the switches S4 to S(M+K) as shown in FIG. 9, and then outputs the control signal SC which turns on the switches S(M+1) and S(M+2) and turns off the switches S1 to SM, and S(M+3) to S(M+K) as shown in FIG. 10.

Current at the node N1 is applied as the output current Iout to the I-V converter 2. The output current Iout equals 3·IE in the arrangement shown in FIG. 9, and equals 2·IE in the arrangement shown in FIG. 10. The I-V converter 2 converts the output current Iout to the output voltage Vout which is an analog signal.

As above described, the N-bit D/A converter of the third preferred embodiment enables the current sources the number of which is determined by the digital signal DIG, starting with the current source in the selection start position determined by the start position determination circuit 3A for each sampling of the digital signal DIG in response to the input digital data (DIG) to convert the digital data DIG to the analog signal (output voltage Vout).

This further increases the number of combinations of the current sources to be selected when the digital signal DIG has the same value, and allows the current sources IS1 to IS(M+K) to be selected with equal frequency independently of the values of the digital signal DIG. The tendency for the difference in characteristics between the individual current sources to appear in the analog output from the D/A converter is reduced. Therefore, the degradation of the linearity of the analog output relative to the digital input is effectively suppressed.

Additionally, the D/A converter of the third preferred embodiment comprises the K redundant current sources to increase the flexibility of the selection start positions over the first preferred embodiment. Consequently, the tendency for the difference in characteristics between the individual current sources to appear in the analog output from the D/A converter is further reduced. Therefore, the third preferred embodiment prevents the degradation of the linearity more effectively than does the first preferred embodiment.

Fourth Preferred Embodiment

The third preferred embodiment shows only that the current sources as the selection start position determined by the start position determination circuit 3A are changed for each sampling. A fourth preferred embodiment of the present invention changes the current sources as the selection start position so that the current sources IS1 to IS(M+K) are selected with more equal frequency. Thus, the D/A converter of the fourth preferred embodiment is similar in general construction to that of the third preferred embodiment shown in FIG. 8 except that the start position determination circuit 3A determines the selection start position in a manner to be described below.

The start position determination circuit 3A finds such a positive number A that the positive number A and the number (M+K) of current sources in the N-bit D/A converter are prime to each other and M>A to shift the selection start position by the displacement count A for each determination of the selection start position.

For example, when N=3 (i.e., M=7), K=6, and A=8 (13(M+K) and 8 are prime to each other), the first selection start position is the current source IS1 (the switch S1 is turned on), the second selection start position is the current source IS9, and subsequent selection start positions are in the following order: IS4, IS12, IS7, IS2, IS10, IS5, IS13, IS8, IS3, IS11, IS5 .... In this manner, all of the current sources IS are selected as the selection start position with completely equal frequency using a relatively great shift of the selection start position.

Figure 11:
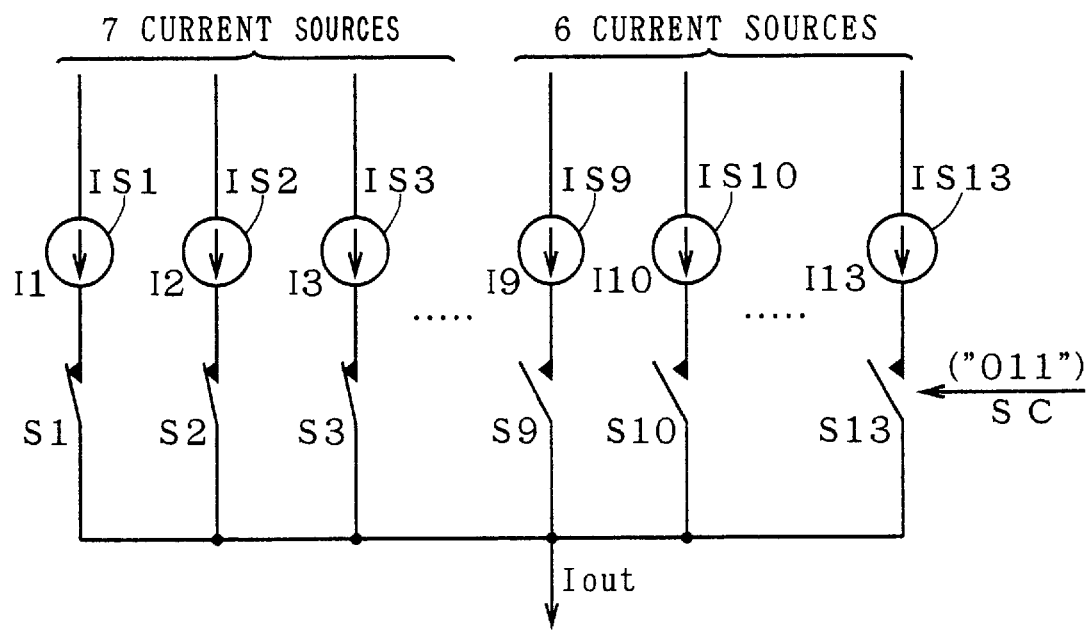
FIGS. 11 and 12 illustrate the D/A conversion according to a fourth preferred embodiment of the present invention.
Figure 12:
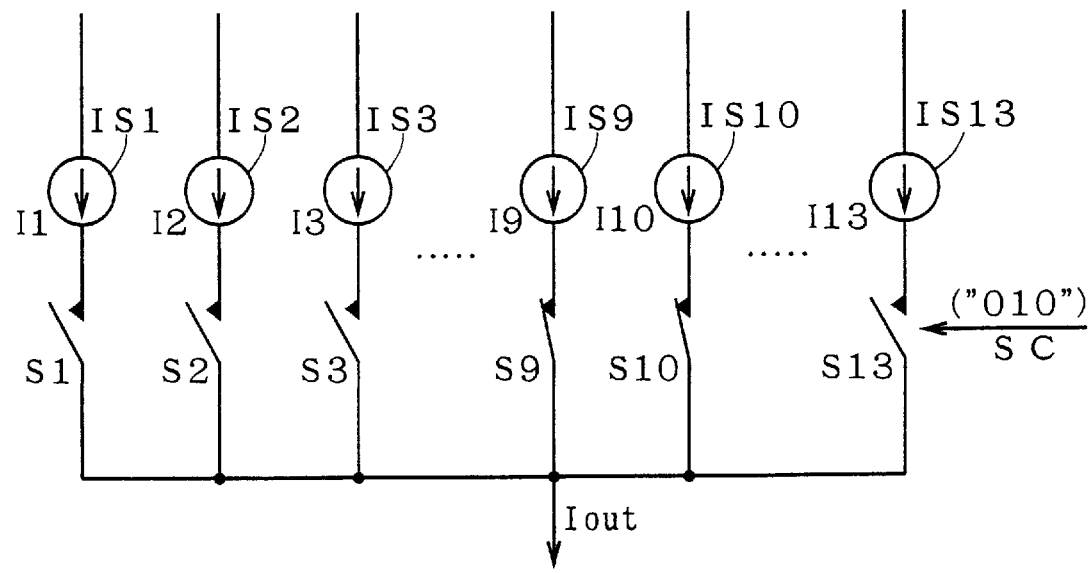

If the digital signal DIG which is "011" (3) is applied to the D/A converter during the first sampling, the current sources IS1 to IS3 are selected as shown in FIG. 11. If the digital signal DIG which is "010" (2) is applied to the D/A converter during the second sampling, the current sources IS9 and IS10 are selected as shown in FIG. 12.

As above described, the start position determination circuit 3A of the D/A converter of the fourth preferred embodiment determines the selection start position bay shifting the selection start position by the displacement count which is prime to the number (M+K) of current sources to provide the flexibility of the (M+K) start positions the number of which includes the number of redundant current sources, maximizing the number of combinations of the current sources to be selected depending on the values of the digital signal DIG. Consequently, the tendency for the difference in characteristics between the individual current sources to appear in the analog output from the D/A converter is further reduced. Therefore, the linearity of the analog output relative to the digital input is improved.

Fifth Preferred Embodiment

Figure 13:
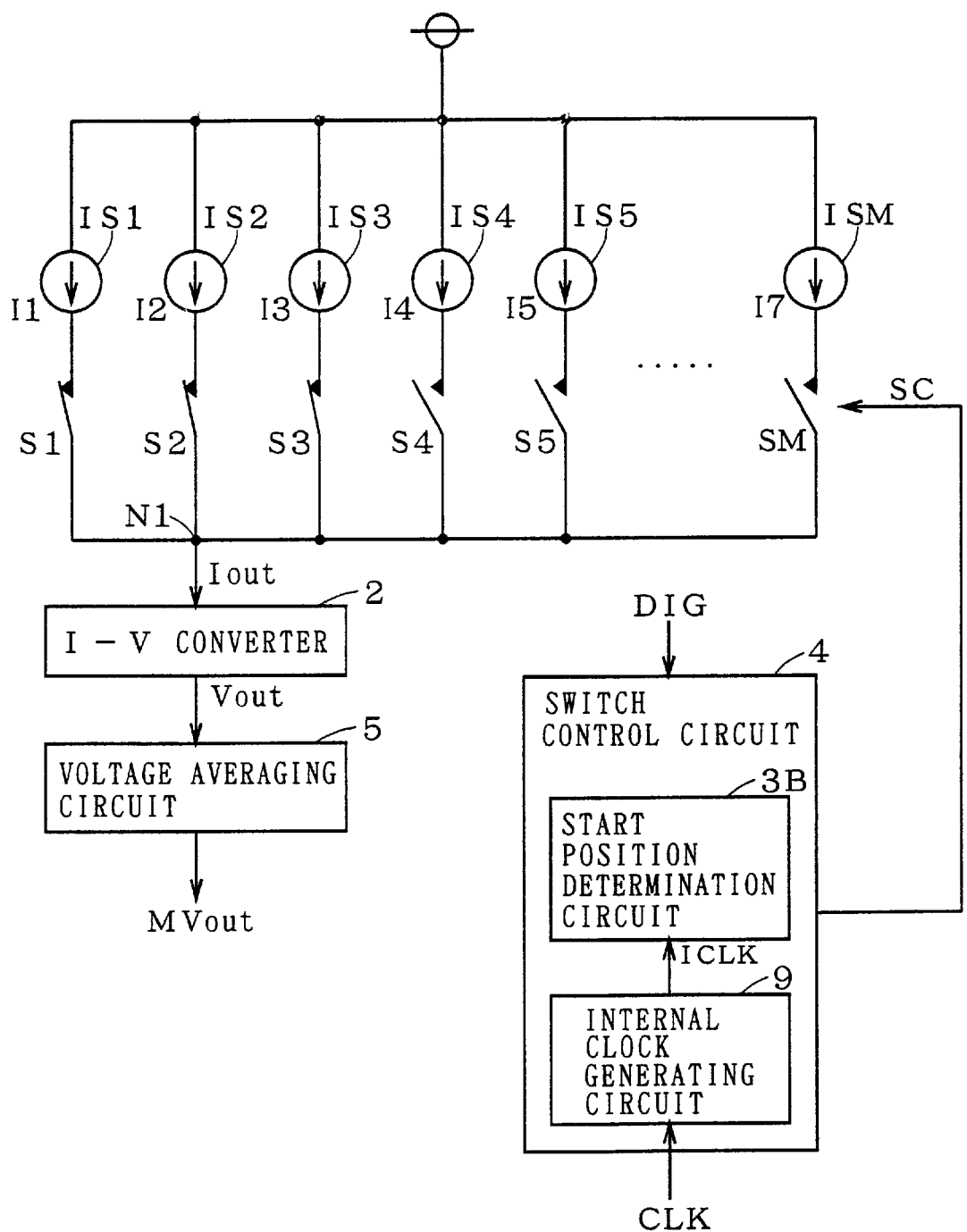
FIG. 13 illustrates a structure of the D/A converter according to a fifth preferred embodiment of the present invention.

FIG. 13 illustrates a structure of the N-bit D/A converter (N≧2) according to a fifth preferred embodiment of the present invention. As shown in FIG. 13, the unit current sources IS1 to ISM are connected at their first ends to the power supply Vcc, and connected at their second ends to the first ends of the switches S1 to SM, respectively, where M denotes the number of required current sources.

The second ends of the switches S1 to SM are connected commonly to the node N1. The N-bit D/A converter is designed so that the current sources IS1 to ISM supply the currents I1 to IM having the same quantity IE.

A switch control circuit 4 outputs the control signal SC to the switches S1 to SM on the basis of the digital signal DIG to turn on some of the switches S1 to SM which are arranged in ascending order of reference characters starting with a switch determined by a start position determination circuit 3B while turning off the remaining switches, the number of switches turned on being dependent upon the digital signal DIG.

Figure 14:
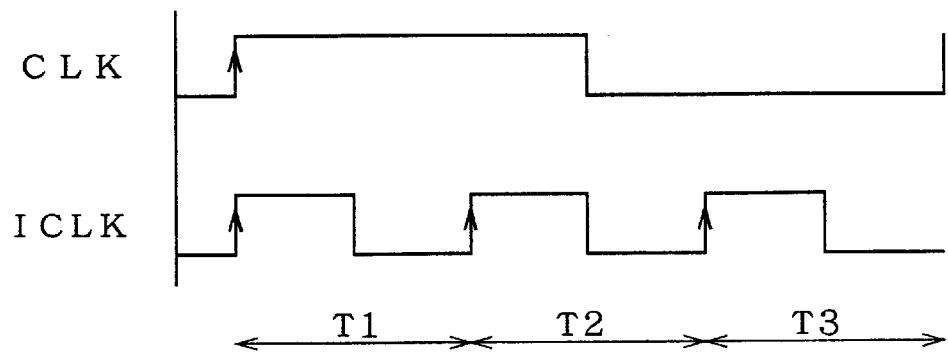
FIG. 14 is a timing chart showing the operation of an internal clock generating circuit shown in FIG. 13.

Upon being triggered by the rising edge of an internal clock signal ICL,K from an internal clock generating circuit 9, the start position determination circuit 3B sequentially changes the switches to determine the selection start position, e.g. S1, S3, S5, . . . . The internal clock generating circuit 9 generates the internal clock signal ICLK which is three times faster than the clock signal CLK in synchronism with the rising edge of the clock signal CLK indicating the input timing of the digital signal DIG, as shown in FIG. 14. Thus, one cycle of the clock signal CLK is divided into three cycles T1 to T3 of the internal clock signal ICLK.

Figure 15:
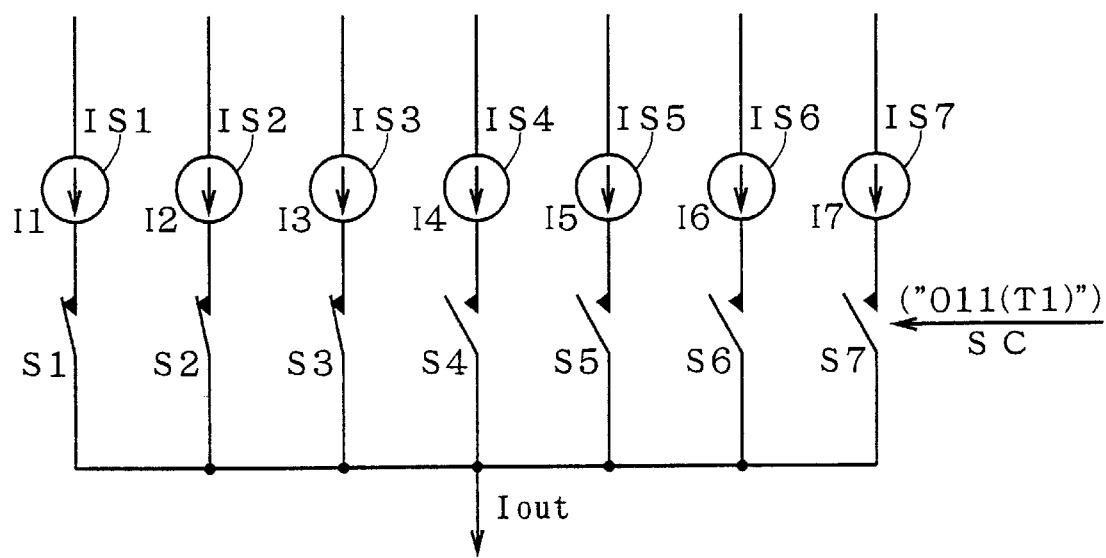
FIGS. 15 through 17 illustrate the D/A conversion according to the fifth preferred embodiment.
Figure 16:
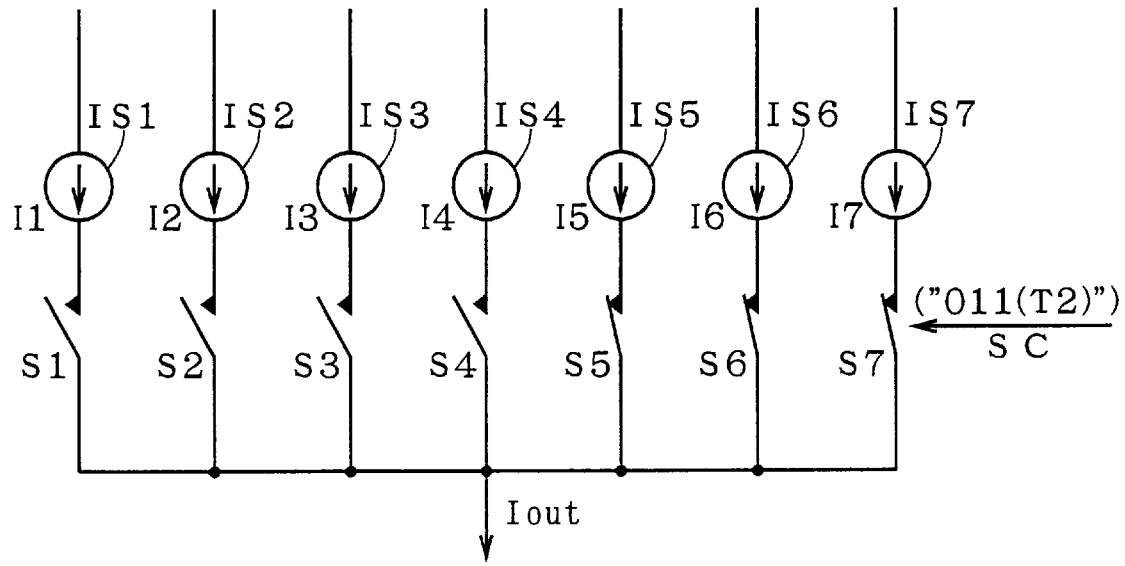
Figure 17:
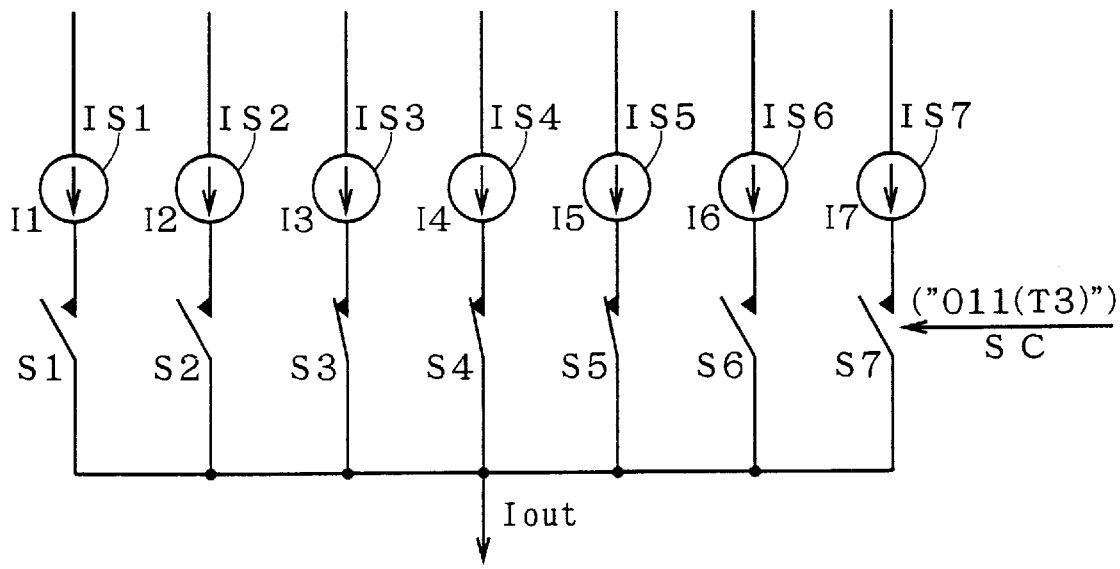

For example, it is assumed that N=3 (M=7), the digital signal DIG is "011" (3), and the start position determination circuit 3B determines the selection start position in the following order: S1, S5, and S3 on the basis of the internal clock signal ICLK. In this case, as shown in FIGS. 15 to 17, the switch control circuit 4 outputs the control signal SC which turns on only the switches S1 to S3 during the time period of the cycle T1 (FIG. 15), turns on only the switches S5 to S7 during the time period of the cycle T2 (FIG. 16), and turns on only the switches S3 to S5 during the time period of the cycle T3 (FIG. 17).

The respective currents at the node N1 during the time periods of the cycles T1 to T3 are applied as output currents Iout (Iout1 to Iout3) to the I-V converter 2. The I-V converter 2 converts the output currents Iout to output voltages Vout (Vout1 to Vout3).

A voltage averaging circuit 5 determines the average of the output voltages Vout1 to Vout3 provided during the time periods of the respective cycles T1 to T3 to output an average output voltage MVout which is an analog signal.

As above described, the N-bit D/A converter of the fifth preferred embodiment enables a plurality of combinations of the current sources the number of which depends on the digital signal DIG during one sampling period, starting with the current source in the selection start position determined by the start position determination circuit 3B for each sampling of the digital signal DIG in response to the input digital data (DIG) to convert the digital data DIG to the analog signal (average output voltage MVout).

This significantly increases the number of combinations of the current sources to be selected in response to the values of the digital signal DIG, and allows the current sources IS1 to ISM to be selected with equal frequency. The tendency for the difference in characteristics between the individual current sources to appear in the analog output from the D/A converter is reduced. Therefore, the degradation of the linearity of the analog output relative to the digital input is effectively suppressed.

Additionally, the D/A converter of the fifth preferred embodiment enables the plurality of combinations of the current sources the number of which depends on the digital signal DIG during one sampling period of the digital signal DIG. Therefore, the current sources are equally enabled in the D/A conversion of the single value of the digital signal DIG. This reduces the tendency toward the appearance of the difference in characteristics between the current sources to provide a higher-accuracy analog signal.

Sixth Preferred Embodiment

The fifth preferred embodiment shows only that the current sources as the selection start position determined by the start position determination circuit 3B are changed for each sampling. A sixth preferred embodiment of the present invention changes the current sources as the selection start position so that the current sources IS1 to IS7 are selected with more equal frequency. Thus, the D/A converter of the sixth preferred embodiment is similar in general construction to that of the fifth preferred embodiment shown in FIG. 13 except that the start position determination circuit 3B determines the selection start position in a manner to be described below.

The start position determination circuit 3B finds such a positive number A that the positive number A and the number M ($=2^N-1$) of current sources in the N-bit D/A converter are prime to each other and M>A to shift the selection start position by the displacement count A for each determination of the selection start position.

For example, when M=3, that is, M=7 and A=5 (7 and 5 are prime to each other), the first selection start position is the current source IS1 (the switch S1 is turned on), the second selection start position is the current source IS6, and subsequent selection start positions are in the following order: IS4, IS2, IS7, IS5, IS3, IS1, IS6, . . . . In this manner, all of the current sources IS are selected as the selection start position with completely equal frequency using a relatively great shift of the selection start position.

Figure 18:
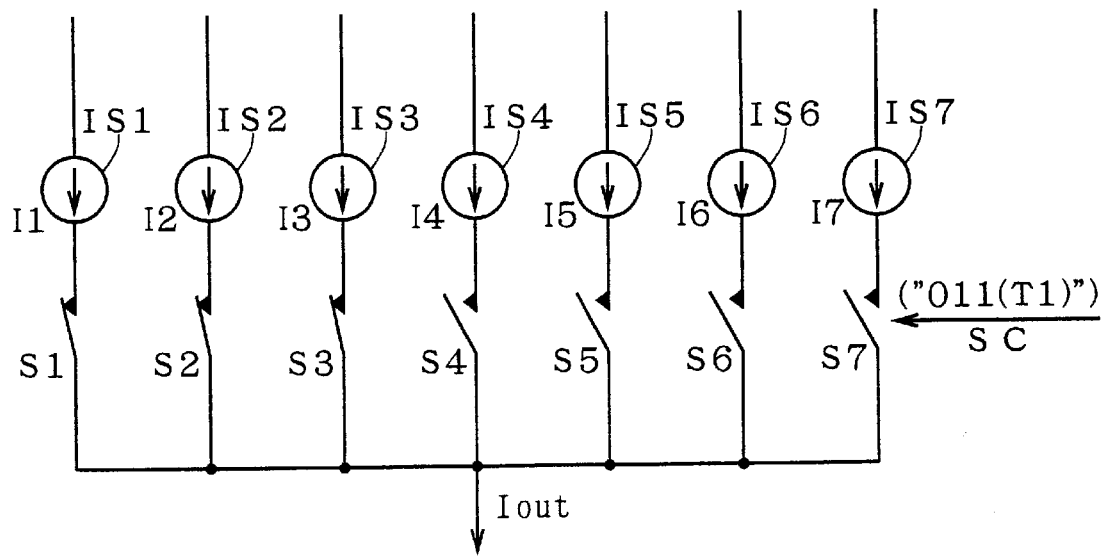
FIGS. 18 through 20 illustrate the D/A conversion according to a sixth preferred embodiment of the present invention.
Figure 19:
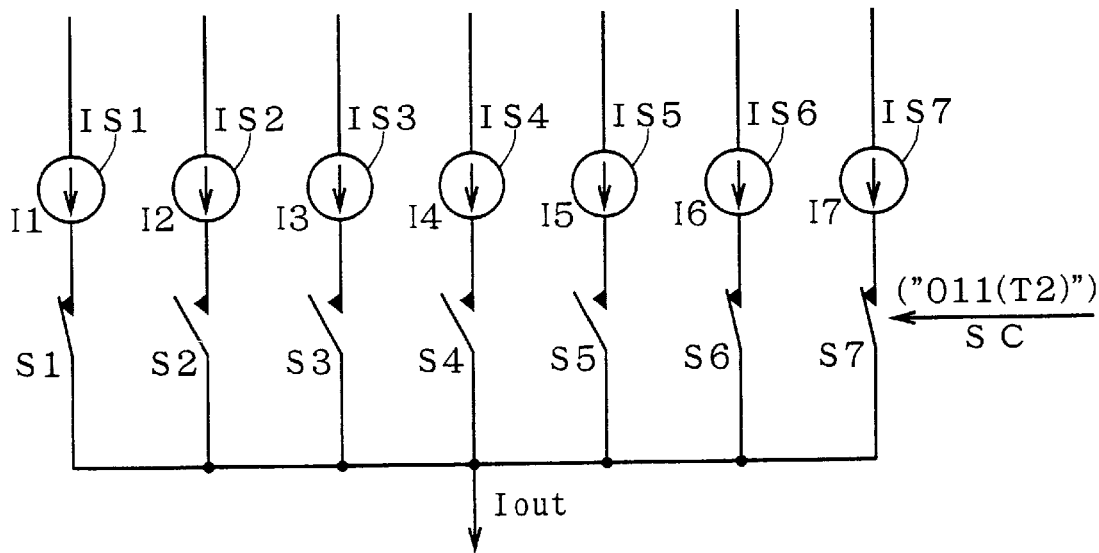
Figure 20:
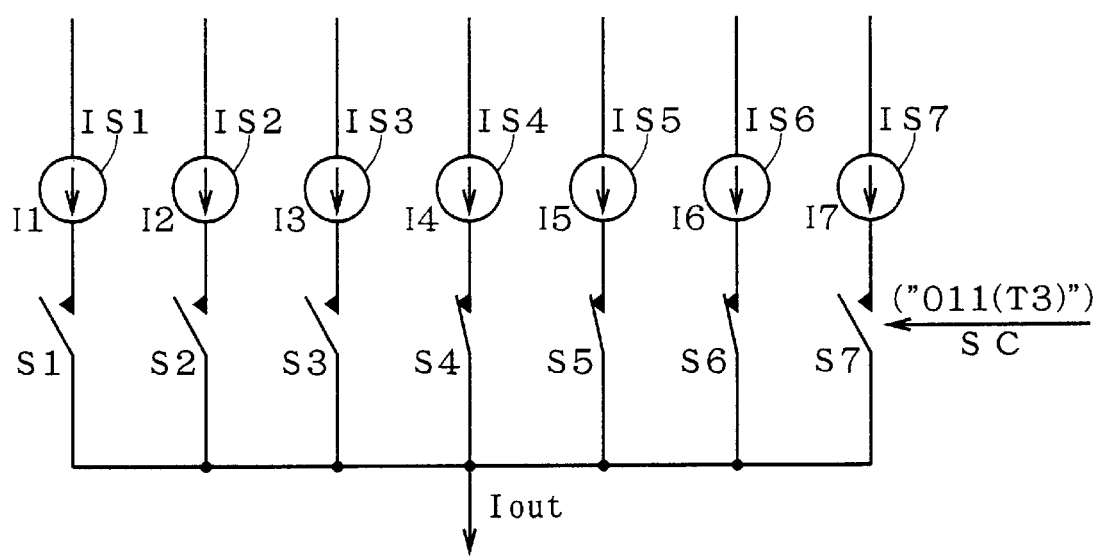

If the digital signal DIG which is "011" (3) is applied to the D/A converter during the first sampling as shown in FIGS. 18 to 20, the current sources IS1 to IS3 are selected during the time period of the cycle T1 (FIG. 18), the current sources IS1, IS6, and IS7 are selected during the time period of the cycle T2 (FIG. 19), and the current sources IS4 to IS6 are selected during the time period of the cycle T3 (FIG. 20).

As above described, the start position determination circuit 3B of the D/A converter of the sixth preferred embodiment shifts the selection start position by the displacement count which is prime to the number of current sources to provide the flexibility of the M start positions, maximizing the number of combinations of the current sources to be selected depending on the values of the digital signal DIG. Consequently, the tendency for the difference in characteristics between the individual current sources to appear in the analog output from the D/A converter is further reduced. Therefore, the degradation of the linearity of the analog output relative to the digital input is minimized.

Seventh Preferred Embodiment

Figure 21:
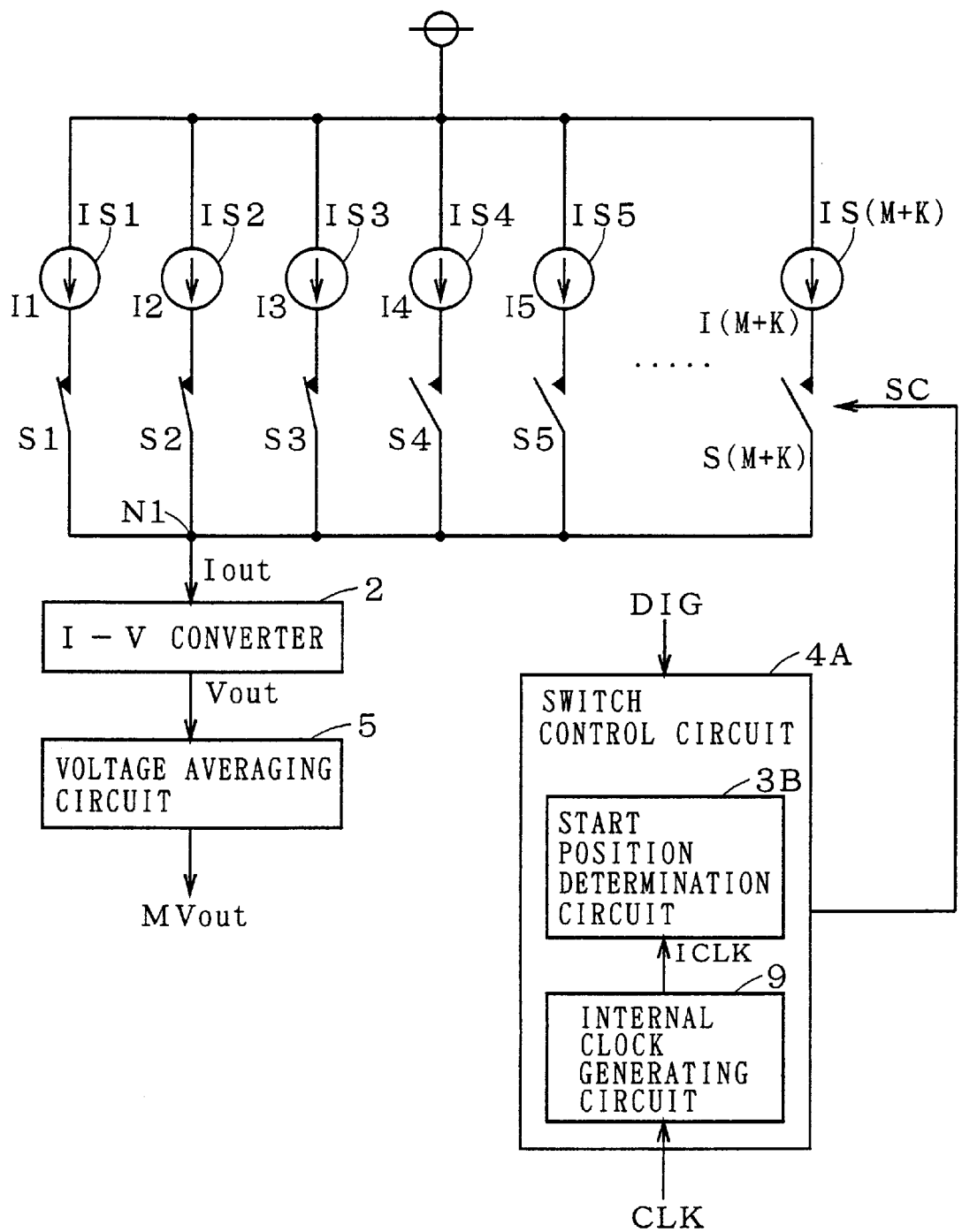
FIG. 21 illustrates a structure of the D/A converter according to a seventh preferred embodiment of the present invention.

FIG. 21 illustrates a structure of the N-bit D/A converter (N≧2) according to a seventh preferred embodiment of the present invention. As shown in FIG. 21, the unit current sources IS1 to IS(M+K) are connected at their first ends to the power supply Vec, and connected at their second ends to the first ends of the switches S1 to S(M+K), respectively, where M denotes the number of required current sources, and K denotes the number of redundant current sources.

The second ends of the switches S1 to S(M+K) are connected commonly to the node N1. The N-bit D/A converter is designed so that the current sources IS1 to IS(M+K) supply the currents I1 to I(M+K) having the same quantity IE.

A switch control circuit 4A outputs the control signal SC to the switches S1 to S(M+K) on the basis of the digital signal DIG to turn on some of the switches S1 to S(M+K) which are arranged in ascending order of reference characters starting with a switch determined by the start position determination circuit 3B while turning off the remaining switches, the number of switches turned on being dependent upon the digital signal DIG.

Upon being triggered by the rising edge of the internal clock signal ICLK from the internal clock generating circuit 9, the start position determination circuit 3B sequentially changes the switches determine the selection start position, e.g. S1, S3, S5, . . . . The internal clock generating circuit 9 generates the internal clock signal ICLK which is three times faster than the clock signal CLK in synchronism with the rising edge of the clock signal CLK indicating the input timing of the digital signal DIG, as shown in FIG. 14. Thus, one cycle of the clock signal CLK is divided into the three cycles T1 to T3 of the internal clock signal ICLK.

Figure 22:
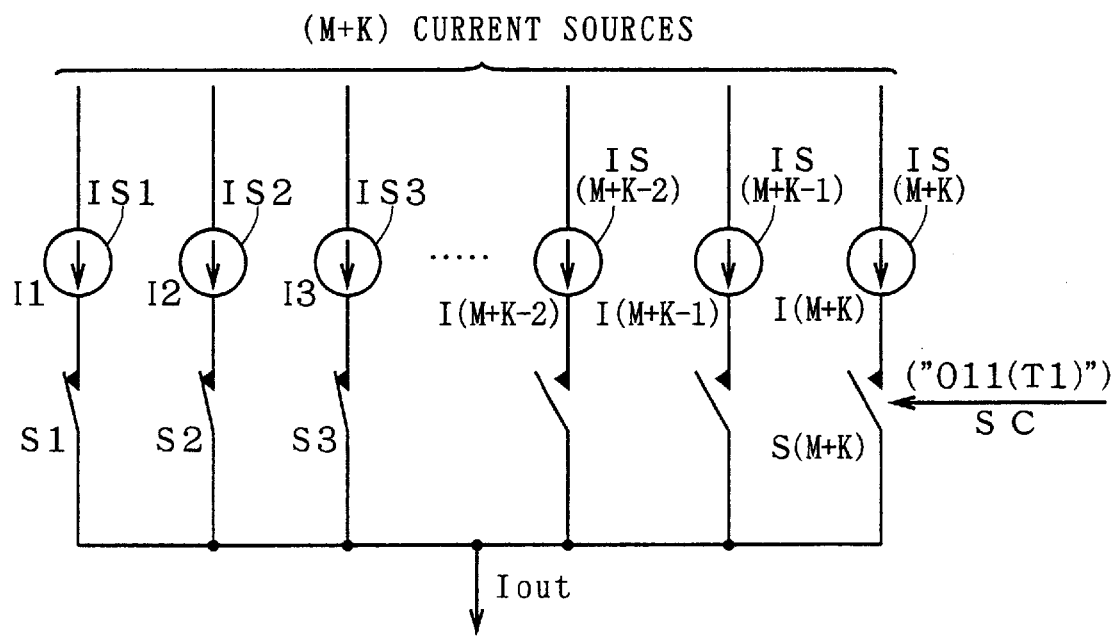
FIGS. 22 through 24 illustrate the D/A conversion according to the seventh preferred embodiment.
Figure 23:
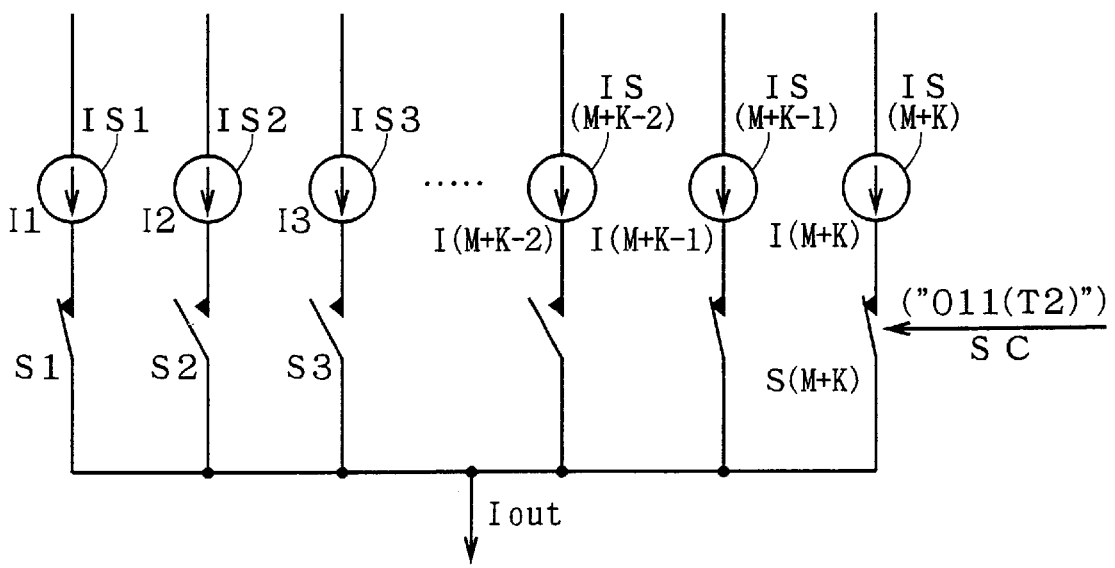
Figure 24:
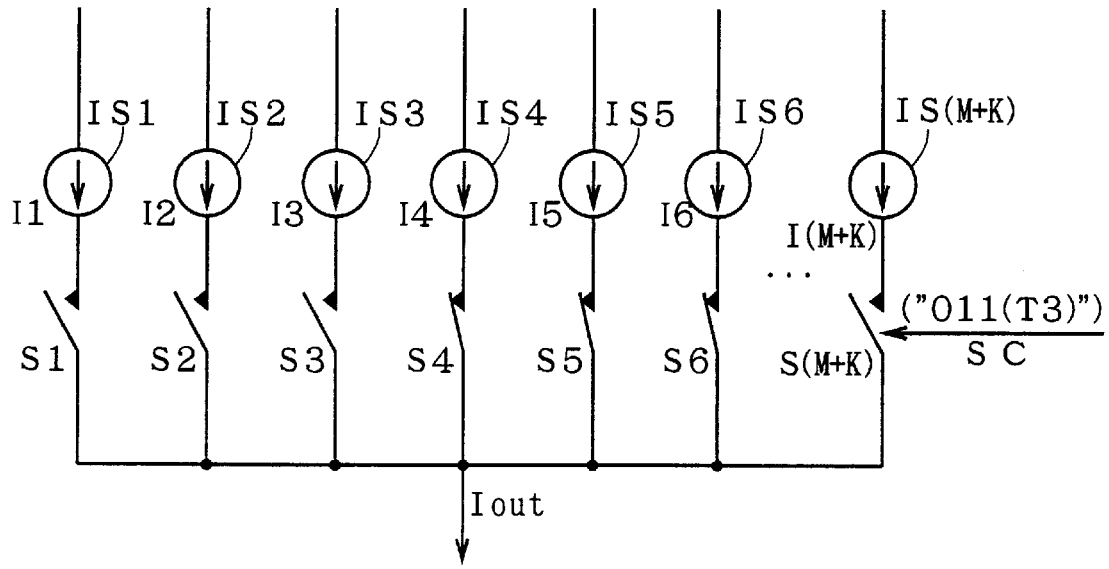

For example, it is assumed that M=3, the digital signal DIG is "011" (3), and the start position determination circuit 3B determines the selection start position in the following order: S1, S(M+K+1), and S4 on the basis of the internal clock signal ICLK. In this case, as shown in FIGS. 22 to 24, the switch control circuit 4A outputs the control signal SC which turns on only the switches S1 to S3 during the time period of the cycle T1 (FIG. 22), turns on only the switches S1, S(M+K−1), and S(M+K) during the time period of the cycle T2 (FIG. 23), and turns on only the switches S4 to S6 during the time period of the cycle T3 (FIG. 24).

The respective currents at the node N1 during the time periods of the cycles T1 to T3 are applied as the output currents Iout (Iout1 to Iout3) to the I-V converter 2. The I-V converter 2 converts the output currents Iout to the output voltages Vout (Vout1 to Vout3).

The voltage averaging circuit 5 determines the average of the output voltages Vout1 to Vout3 provided during the time periods of the respective cycles T1 to T3 to output the average output voltage MVout which is an analog signal.

As above described, the N-bit D/A converter of the seventh preferred embodiment enables a plurality of combinations of the current sources the number of which depends on the digital signal DIG, starting with the current source in the selection start position determined by the start position determination circuit 3B for each sampling of the digital signal DIG in response to the input digital data (DIG) to convert the digital data DIG to the analog signal (average output voltage MVout).

This significantly increases the number of combinations of the current sources to be selected in response to the values of the digital signal DIG, and allows the current sources IS1 to IS(M+K) to be selected with equal frequency. The tendency for the difference in characteristics between the individual current sources to appear in the analog output from the D/A converter is reduced. Therefore, the degradation of the linearity is effectively suppressed.

Additionally, the D/A converter of the seventh preferred embodiment enables the plurality of combinations of the current sources during one sampling period of the digital signal DIG. Therefore, the current sources are equally enabled in the D/A conversion of the single value of the digital signal DIG. This reduces the tendency toward the appearance of the difference in characteristics between the current sources to provide a higher-accuracy analog signal.

Furthermore, the D/A converter of the seventh preferred embodiment comprises the K redundant current sources to increase the flexibility of the selection start positions over the fifth preferred embodiment. Therefore, the seventh preferred embodiment prevents the degradation of the linearity of the analog output relative to the digital input more effectively than does the fifth preferred embodiment.

Eighth Preferred Embodiment

The seventh preferred embodiment shows only that the plurality of combinations of the current sources as the selection start position determined by the start position determination circuit 3B are changed during the single sampling period. An eighth preferred embodiment of the present invention changes the current sources as the selection start position so that the current sources IS1 to IS(M+K) are selected with more equal frequency. Thus, the D/A converter of the eighth preferred embodiment is similar in general construction to that of the seventh preferred embodiment shown in FIG. 21 except that the start position determination circuit 3B determines the selection start position in a manner to be described below.

The start position determination circuit 3B finds such a positive number A that the positive number A and the number (M+K) of current sources in the N-bit D/A converter are prime to each other and M>A to shift the selection start position by the displacement count A for each determination of the selection start position.

For example, when N=3 (i.e., M=7), K=6, and A=8 (13 (M+K) and 8 are prime to each other), the first selection start position is the current source IS1 (the switch S1 is turned on), the second selection start position is the current source IS9, and subsequent selection start positions are in the following order: IS4, IS12, IS7, IS2, IS10, IS5, IS13, IS8, IS3, IS11, IS5 . . . . In this manner, all of the current sources IS are selected as the selection start position with completely equal frequency using a relatively great shift of the selection start position.

Figure 25:
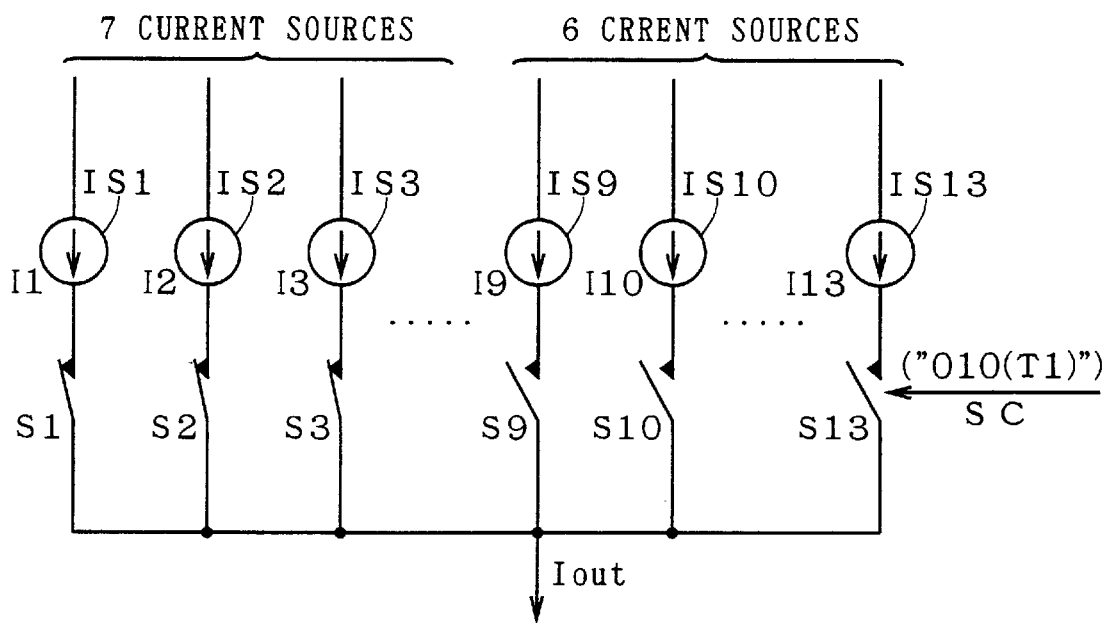
FIGS. 25 through 27 illustrate the D/A conversion according to an eighth preferred embodiment of the present invention.
Figure 26:
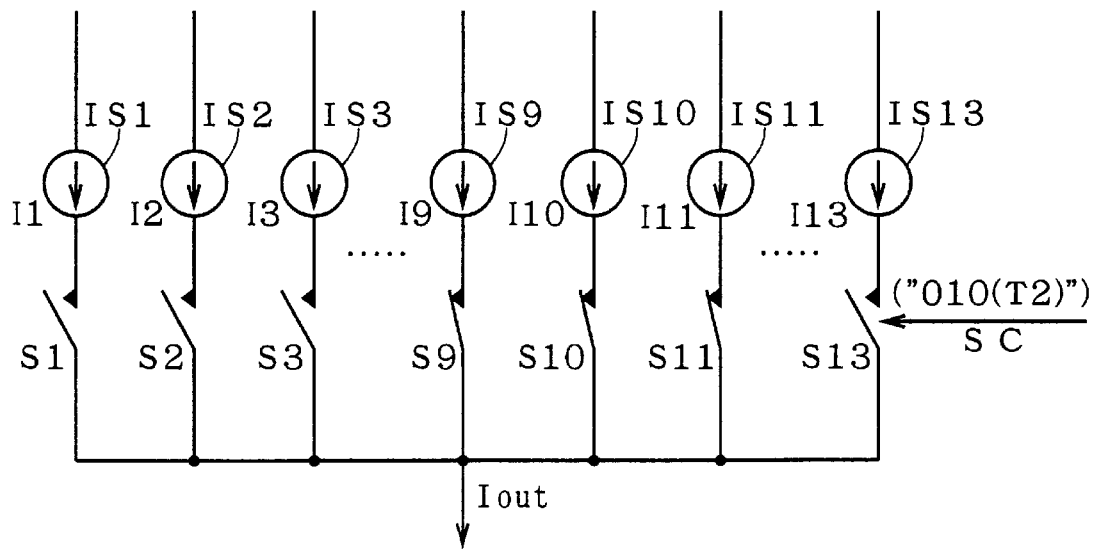
Figure 27:
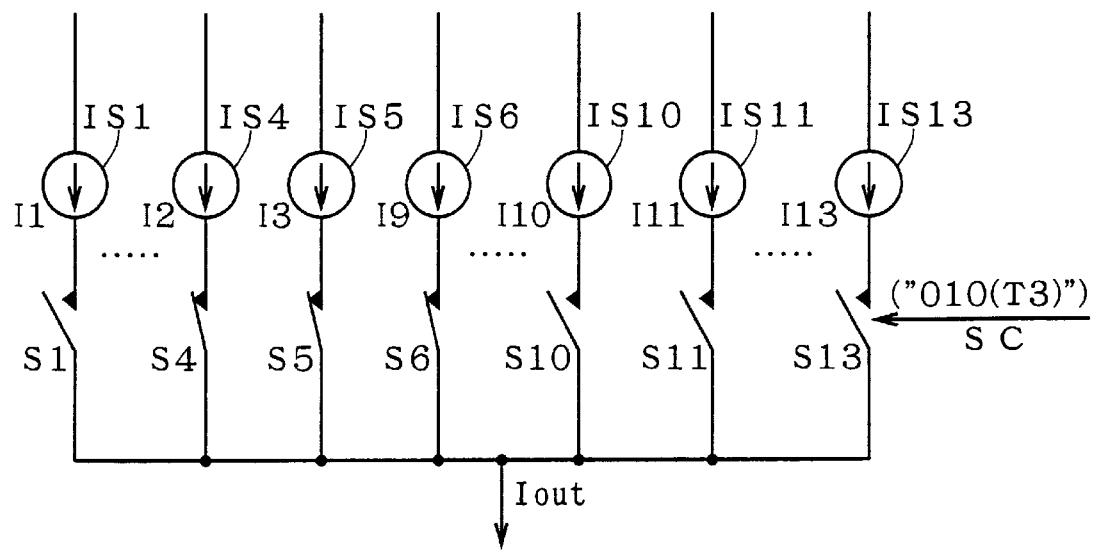

If the digital signal DIG which is "011" (3) is applied to the D/A converter during the first sampling as shown in FIGS. 25 to 27 the current sources IS1 to IS3 are selected during the time period of the cycle T1 (FIG. 25), the current sources IS9 to IS11 are selected during the time period of the cycle T2 (FIG. 26), and the current sources IS4 to IS6 are selected during the time period of the cycle T3 (FIG. 27).

As above described, the start position determination circuit 3B of the D/A converter of the eighth preferred embodiment shifts the selection start position by the displacement count which is prime to the number (M+K) of current sources to provide the flexibility of the (M+K) start positions the number of which includes the number of redundant current sources, maximizing the number of combinations of the current sources to be selected depending on the values of the digital signal DIG. Consequently, the tendency for the difference in characteristics between the individual current sources to appear in the analog output from the D/A converter is further reduced. Therefore, the degradation of the linearity is minimized.

Additionally, the D/A converter of the eighth preferred embodiment enables the plurality of combinations of the current sources during one sampling period of the digital signal DIG. Therefore, the current sources are equally enabled in the D/A conversion of the single value of the digital signal DIG. This reduces the tendency toward the appearance of the difference in characteristics between the current sources to provide a higher-accuracy analog signal.

Simplification of Start Position Determination Circuit

Figure 28:
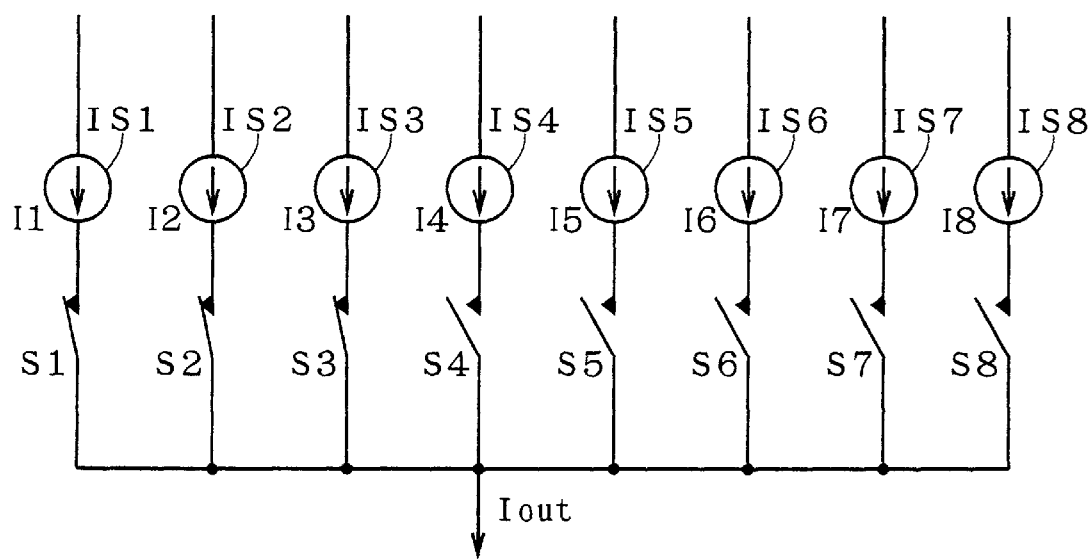
FIG. 28 illustrates an arrangement of current sources which permits simplification of a start position determination circuit.

In the eighth preferred embodiment, when M=7 (M=3), K=1, and A=) 3 (8 (M+K) and 3 are prime to each other), a start position determination circuit of relatively simple circuit construction may be provided, as shown in FIG. 28, by removing the zero adjustment circuit 18 from the start position determination circuit 3 shown in FIGS. 2 and 3. The same is true for the start position determination circuit 3A of the third and fourth preferred embodiment and for the start position determination circuit 3B of the seventh preferred embodiment.

Specifically, the current sources IS1 to IS8 are associated with the latch data "000" to "111" from the latch portion 8, respectively. Then, the first selection start position is the current source IS1, the second selection start position is the current source IS4 (the switch S4), and subsequent selection start positions are in the following order: IS7, IS2, IS5, IS8, IS3, IS6, IS1 . . . . In this manner, the current sources IS are selected as the selection start position with completely equal frequency using a shift of the selection start position.

Thus, the selection of the structure which satisfies (M+K)=$2^N$ may simplify the structure of the start position determination circuit 3.

Application to Capacitor Array

The first to eighth preferred embodiments describe the current source array type D/A converter which uses the current sources as unit electricity quantity generating portions. Alternatively, a capacitor array type D/A converter which uses capacitors as the unit electricity quantity generating portions may be employed as shown in FIG. 29.

Figure 29:
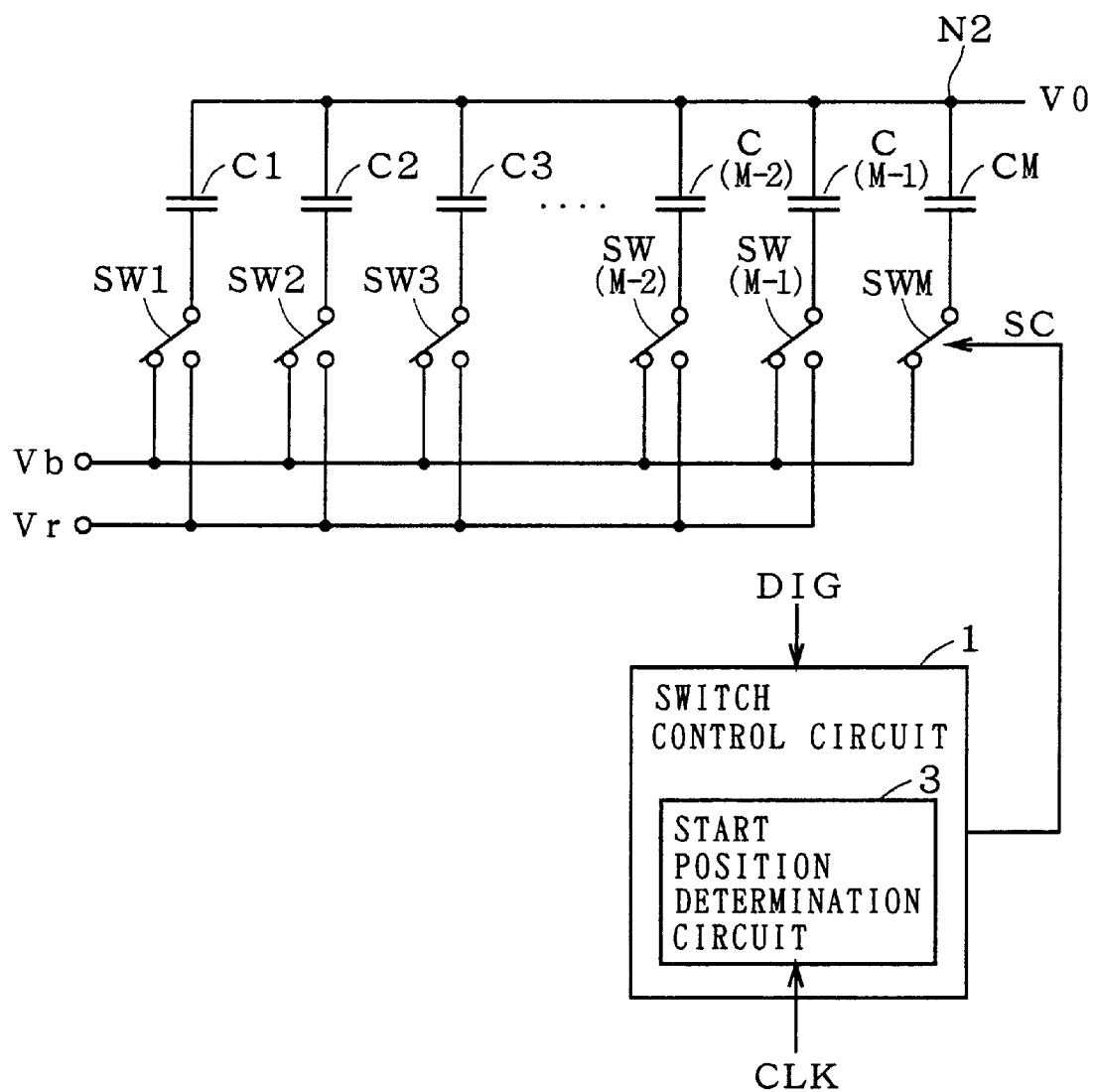
FIG. 29 illustrates a modification of the first to eighth preferred embodiments.

As shown in FIG. 29, unit capacitors C1 to CM are connected at their first ends to a node N2 serving as an output portion, and connected at their second ends to the first ends of switches SW1 to SWM, respectively, where M denotes the number of required capacitors and equals $2^N-1$. Voltage on a signal line connected to the node N2 is an output voltage Vo.

A constant voltage Vb is commonly applied to the second ends of the witches SW1 to SWM in the off position, and a constant voltage Vr is commonly applied to the second ends of the switches SW1 to SWM in the on position. The N-bit D/A converter is designed so that the capacitors C1 to CM have the same capacitance CE.

The D/A converter shown in FIG. 29 is similar in the structure of the switch control circuit 1 including the start position determination circuit 3 to that of the first preferred embodiment shown in FIGS. 1 to 3.

In this arrangement, all of the switches SW1 to SWM are initially turned off to apply the voltage Vb to the capacitors C1 to CM. Thereafter, x switches among the switches SW1 to SWM are turned on in response to the digital signal DIG to apply the voltage Vr to the second ends of the capacitors C connected to the x switches.

Based on the principle of conservation of charge, $$(M-x)C(Vo-Vb)+x\ C\ (Vo-Vr)=0$$

holds.

Solving the above equation gives $$Vo=(x/M)(Vr-Vb)-Vb$$

Consequently, the output voltage Vo (analog signal) is provided which depends on the number x of switches in the on position, that is, the number of selected capacitors.

In this manner, the use of the capacitor array shown in FIG. 29 in place of the current source array in the first to eighth preferred embodiments also provides a D/A converter equivalent to that of the first to eighth preferred embodiments.

Application to Oversampling ΔΣ Technique

Figure 30:
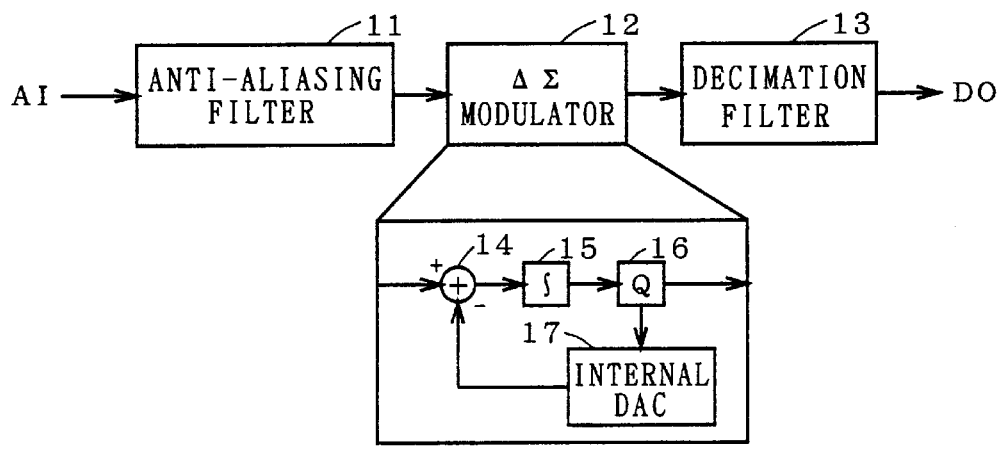
FIG. 30 is a block diagram of an A/D converter using an oversampling ΔΣ conversion technique.
Figure 31:
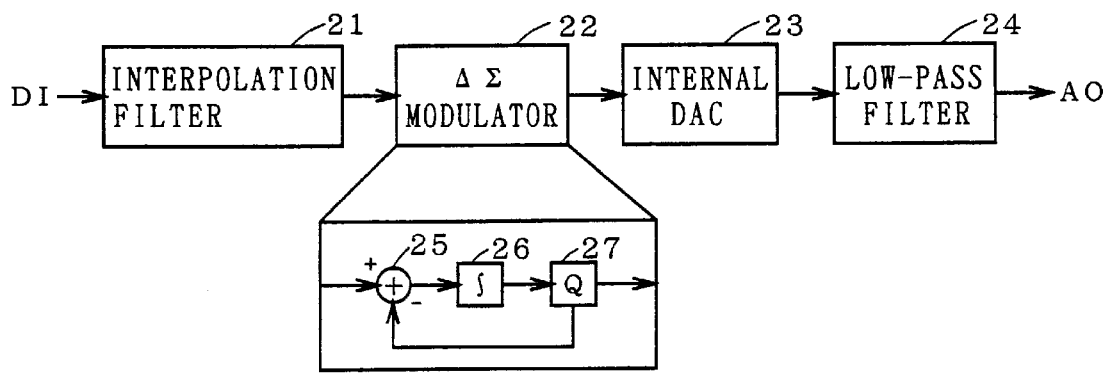
FIG. 31 is a block diagram of a D/A converter using the oversampling ΔΣ conversion technique.
Figure 32:
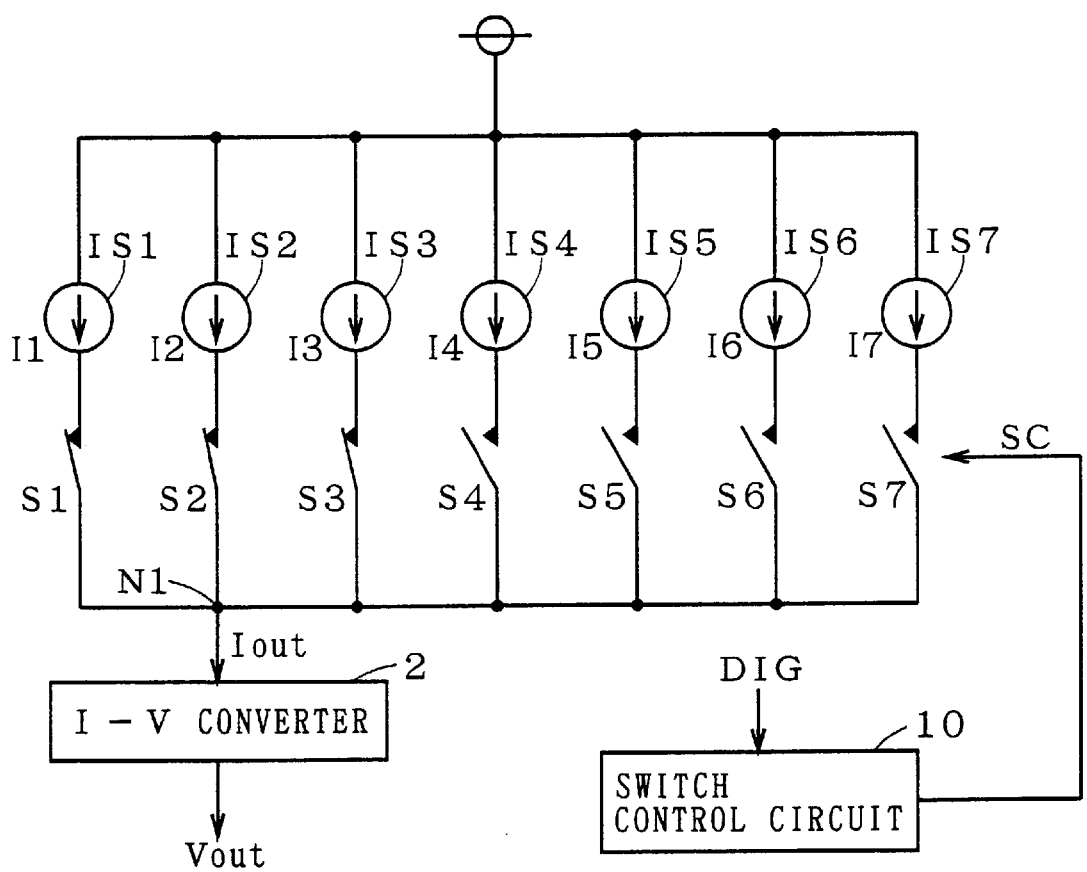
FIG. 32 illustrates an internal structure of a conventional D/A converter.
Figure 33:
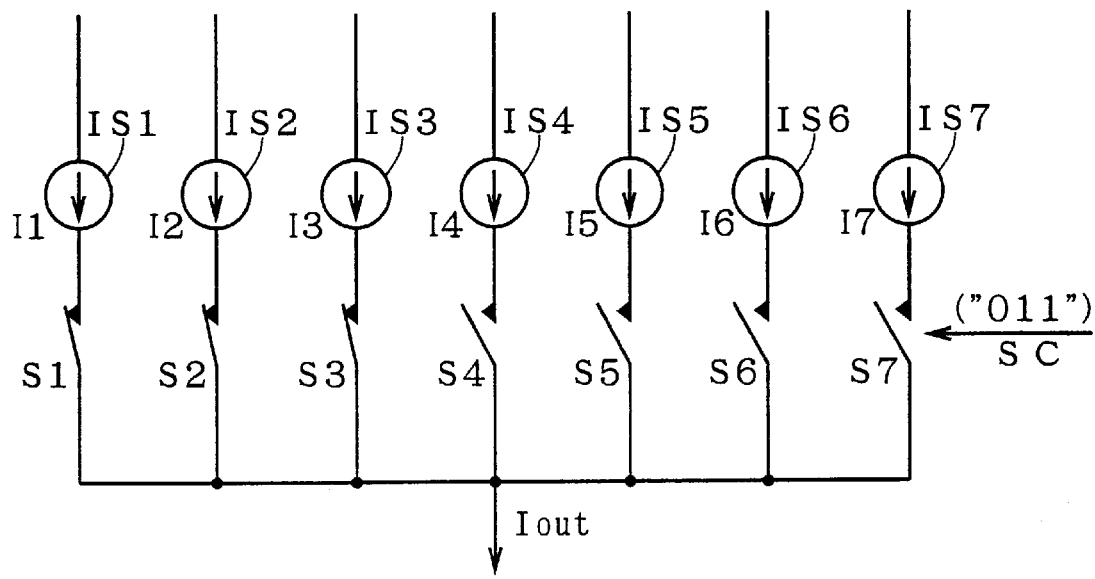
FIGS. 33 and 34 illustrate conventional D/A conversion.
Figure 34:
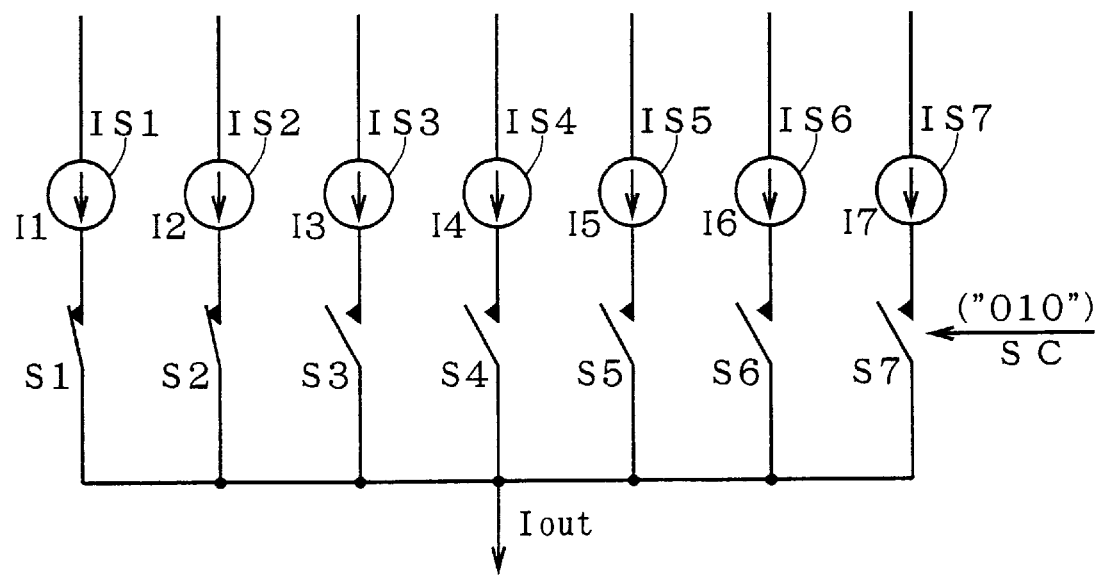

The use of the D/A converter described in the first to eighth preferred embodiments as the multi-bit internal DAC 17 of the oversampling ΔΣ ADC shown in FIG. 30 or as the internet DAC 23 of the oversampling ΔΣ DAC shown in FIG. 31 reduces the quantization noise and provides satisfactory system stability. Further, the D/A converter of the present invention ensures the linearity of the analog output relative to the digital input, providing the oversampling ΔΣ ADC or oversampling ΔΣ DAC having high operating performance.

While the invention has been described in detail, the foregoing description is in all aspects illustrative and not restrictive. It is understood that numerous other modifications and variations can be devised without departing from the scope of the invention.

We claim:

1. A D/A converter for converting a multi-bit digital signal to an analog signal in synchronism with a clock signal, comprising:

a plurality of unit electricity quantity generating portions connected in parallel in predetermined order to an output portion, the quantity of electricity associated with a selected number of unit electricity quantity generating portions among said plurality of unit electricity quantity generating portions being developed at said output portion;

a start position determination portion for sequentially changing and determining a selection start position of said plurality of unit electricity quantity generating portions in synchronism with said clock signal;

a selection portion receiving said digital signal in synchronism with said clock signal and for selecting some of said plurality of unit electricity quantity generating portions in said predetermined order starting with said selection start position, the number of selected unit electricity quantity generating portions being determined by said digital signal; and an analog signal output portion for outputting said analog signal on the basis of said quantity of electricity provided at said output portion;

wherein said digital signal comprises an N-bit digital signal, where N≧2, wherein said plurality of unit electricity quantity generating portions comprise L unit electricity generating portions, where L≧3, and wherein said start position determination portion determines said selection start position while shifting said selection start position by a displacement count A in said predetermined order in synchronism with said clock signal, where A<L, and wherein the number L of unit electricity quantity generating portions and said displacement count A are prime to each other.

2. The D/A converter according to claim 1, wherein said digital signal comprises an N-bit digital signal, where $N \geq 2$, wherein said plurality of unit electricity quantity generating portions comprise L unit electricity quantity generating portions, where $L \geq 3$, and wherein said start position determination portion determines said selection start position while shifting said selection start position by a displacement count A in said predetermined order in synchronism with said clock signal, where A<L.

3. The D/A converter according to claim 2, wherein the number N of bits of said digital signal and the number L of unit electricity quantity generating portions satisfy $L > 2^N - 1$.

4. The D/A converter according to claim 1, wherein said start position determination portion determines first to P-th selection start positions sequentially changed for first to P-th time periods in one cycle of said clock signal, respectively, where $P \geq 2$, wherein said selection portion selects some of said unit electricity quantity generating portions in said predetermined order starting with said first to P-th selection start positions for said first to P-th time periods, respectively, the number of selected unit electricity quantity generating portions being determined by said digital signal, and wherein said analog signal generating portion outputs said analog signal based on the average of the quantities of electricity provided at said output portion for said first to P-th time periods.

5. The D/A converter according to claim 4, wherein said digital signal comprises an N-bit digital signal, where $N \geq 2$, wherein said plurality of unit electricity quantity generating portions comprise L unit electricity quantity generating portions, where $L \geq 3$, and wherein said start position determination portion determines said first to P-th selection start positions while shifting said first to P-th selection start positions by a displacement count A in said predetermined order in synchronism with said clock signal, where A<L.

6. The D/A converter according to claim 5, wherein the number N of bits of said digital signal and the number L of unit electricity quantity generating portions satisfy $L > 2^N - 1$.

7. The D/A converter according to claim 6, wherein the number N of bits of said digital signal and the number L of unit electricity quantity generating portions satisfy $L = 2^N$.

8. The D/A converter according to claim 1, wherein said plurality of unit electricity quantity generating portions comprise a plurality of current sources, each of said current sources supplying predetermined fixed current to said output portion when selected, and wherein said analog signal output portion comprises a current-to-voltage converter portion for converting current provided at said output portion to voltage specified as said analog signal.

9. The D/A converter according to claim 1, wherein said plurality of unit electricity quantity generating portions comprise a plurality of capacitors each having a first electrode, and a second electrode connected commonly to said output portion, each of said capacitors receiving first voltage at its first electrode when selected and receiving second voltage at its first electrode when not selected, and wherein said analog signal output portion comprises a signal line connected to said output portion, said output portion providing voltage specified as said analog signal on said signal line.

10. The D/A converter according to claim 1, wherein A=5 and L=7.

11. A D/A converter for converting a multi-bit digital signal to an analog signal in synchronism with a clock signal comprising:

a plurality of unit electricity quantity generating portions connected in parallel in predetermined order to an output portion the quantity of electricity associated with a selected number of unit electricity quantity generating portions among said plurality of unit electricity quantity generating portions being developed at said output portion;

a start position determination portion for sequentially changing and determining a selection start position of said plurality of unit electricity quantity generating portions in synchronism with said clock signal;

a selection portion receiving said digital signal in synchronism with said clock signal and for selecting some of said plurality of unit electricity quantity generating portions in said predetermined order starting with said selection start position, the number of selected unit electricity quantity generating portions being determined by said digital signal; and an analog signal output portion for outputting said analog signal on the basis of said quantity of electricity provided at said output portion;

wherein said start position determination portion determines first to P-th selection start positions sequentially changed for first to P-th time periods in one cycle of said clock signal, respectively, where $P \geq 2$, wherein said selection portion selects some of said unit electricity quantity generating portions in said predetermined order starting with said first to P-th selection start positions for said first to P-th time periods, respectively, the same number of selected unit electricity quantity generating portions being determined by said digital signal, and further including an averaging circuit for averaging the quantities of electricity provided at said output portion for said first to P-th time periods and outputting a result of the averaging.

12. The D/A converter according to claim 11, wherein said plurality of unit electricity quantity generating portions generate current, and further including a converter which converts the current to voltage, and said averaging circuit is connected to an output of said converter.

13. A ΔΣ A/D converter comprising a ΔΣ modulation portion for ΔΣ modulating and converting an analog signal to a digital signal, said ΔΣ modulation portion comprising:

a subtracter for determining a difference between an analog input signal and an analog signal for subtraction to output an analog difference signal;

an integrator for integrating said analog difference signal;

a quantizer for quantizing an output from said integrator to output a multi-bit digital signal; and a multi-bit internal D/A converter for converting said digital signal to said analog signal for subtraction to output said analog signal for subtraction, said internal D/A converter comprising:
- a plurality of unit electricity quantity generating portions connected in parallel in predetermined order to an output portion, the quantity of electricity associated with a selected number of unit electricity quantity generating portions among said plurality of unit electricity quantity generating portions being developed at said output portion;
- a start position determination portion for sequentially changing and determining a selection start position of said plurality of unit electricity quantity generating portions in synchronism with said clock signal;
- a selection portion receiving said digital signal in synchronism with said clock signal and for selecting some of said plurality of unit electricity quantity generating portions in said predetermined order starting with said selection start position, the number of selected unit electricity quantity generating portions being determined by said digital signal; and
- an analog signal output portion for outputting said analog signal on the basis of said quantity of electricity provided at said output portions wherein said digital signal comprises an N-bit digital signal, where $N \geq 2$, wherein said plurality of unit electricity quantity generating portions comprise L unit electricity generating portions, where $L \geq 3$, and wherein said start position determination portion determines said selection start position while shifting said selection start position by a displacement count A in said predetermined order in synchronism with said clock signal, where A<L, and wherein the number L of unit electricity quantity generating portions and said displacement count A are prime to each other.

14. A ΔΣ D/A converter comprising:

a ΔΣ modulation portion for ΔΣ modulating a multi-bit digital signal to output a ΔΣ modulated digital signal; and a multi-bit internal D/A converter for converting said ΔΣ modulated digital signal to an analog signal to output said analog signal, said internal D/A converter comprising:
- a plurality of unit electricity quantity generating portions connected in parallel in predetermined order to an output portion, the quantity of electricity associated with a selected number of unit electricity quantity generating portions among said plurality of unit electricity quantity generating portions being developed at said output portion;
- a start position determination portion for sequentially changing and determining a selection start position of said plurality of unit electricity quantity generating portions in synchronism with said clock signal;
- a selection portion receiving said digital signal in synchronism with said clock signal and for selecting some of said plurality of unit electricity quantity generating portions in said predetermined order starting with said selection start position, the number of selected unit electricity quantity generating portions being determined by said digital signal; and
- an analog signal output portion for outputting said analog signal on the basis of said quantity of electricity provided at said output portion, wherein said digital signal comprises an N-bit digital signal, where $N \geq 2$, wherein said plurality of unit electricity quantity generating portions comprise L unit electricity generating portions, where $L \geq 3$, and wherein said start position determination portion determines said selection start position while shifting said selection start position by a displacement count A in said predetermined order in synchronism with said clock signal, where A<L, and wherein the number L of unit electricity quantity generating portions and said displacement count A are prime to each other.

15. A D/A converter for converting a multi-bit digital signal to an analog signal in synchronism with a clock signal, comprising:

a plurality of unit electricity quantity generating portions connected in parallel in predetermined order to an output portion, the quantity of electricity associated with a selected number of unit electricity quantity generating portions among said plurality of unit electricity quantity generating portions being developed at said output portion;

a start position determination portion for sequentially changing and determining a selection start position of said plurality of unit electricity quantity generating portions in synchronism with said clock signal;

a selection portion receiving said digital signal in synchronism with said clock signal and for selecting some of said plurality of unit electricity quantity generating portions in said predetermined order starting with said selection start position, the number of selected unit electricity quantity generating portions being determined by said digital signal; and an analog signal output portion for outputting said analog signal on the basis of said quantity of electricity provided at said output portion;

wherein said digital signal comprises an N-bit digital signal, where $N \geq 2$, wherein said plurality of unit electricity quantity generating portions comprise L unit electricity generating portions, where $L \geq 3$, and wherein said start position determination portion determines said selection start position while shifting said selection start position by a displacement count A in said predetermined order in synchronism with said clock signal, where A<L, wherein the number N of bits of said digital signal and the number of L of unit electricity quantity generating portions satisfy $L=2^N$.

* * * * *